(12) United States Patent
Shiba et al.

(10) Patent No.: US 9,941,217 B2
(45) Date of Patent: Apr. 10, 2018

(54) MARK, METHOD FOR FORMING SAME, AND EXPOSURE APPARATUS

(71) Applicant: NIKON CORPORATION, Tokyo (JP)

(72) Inventors: Yuji Shiba, Ageo (JP); Tomoharu Fujiwara, Gyoda (JP); Nobutaka Magome, Kumagaya (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 14/590,376

(22) Filed: Jan. 6, 2015

(65) Prior Publication Data
US 2015/0200165 A1    Jul. 16, 2015

Related U.S. Application Data

(63) Continuation of application No. PCT/JP2013/068752, filed on Jul. 9, 2013.

(30) Foreign Application Priority Data

Jul. 10, 2012 (JP) .............................. 2012-154373

(51) Int. Cl.
*H01L 23/544* (2006.01)
*H01L 21/308* (2006.01)
(Continued)

(52) U.S. Cl.
CPC ............ *H01L 23/544* (2013.01); *G03F 9/708* (2013.01); *H01L 21/3086* (2013.01);
(Continued)

(58) Field of Classification Search
CPC ............ H01L 23/544; H01L 21/76224; H01L 21/3086; H01L 2924/0002;
(Continued)

(56) References Cited

U.S. PATENT DOCUMENTS 6,118,516 A * 9/2000 Irie ..................... G03F 7/70125
355/53
7,687,925 B2 * 3/2010 Marokkey ........... G03F 7/70633
257/774
(Continued)

FOREIGN PATENT DOCUMENTS

| JP | 2008-311571 A | 12/2008 |
|---|---|---|
| JP | 2009-147317 A | 7/2009 |
| JP | 2010-269304 A | 12/2010 |

OTHER PUBLICATIONS

Aug. 6, 2013 International Search Report issued in PCT/JP2013/068752.
Aug. 6, 2013 Written Opinion of the International Searching Authority issued in PCT/JP2013/068752.
Aug. 1, 2016 Chinese Office Action issued in Applicaion No. 201380042441.1.

*Primary Examiner* — Kyoung Lee
(74) *Attorney, Agent, or Firm* — Oliff PLC

(57) ABSTRACT

A mark forming method includes: forming recessed portion on a mark formation area of a substrate; coating the recessed portion with a polymer layer containing a block copolymer; allowing the polymer layer in the recessed portion to form a self-assembled area; selectively removing a portion of the self-assembled area; and forming a positioning mark by using the self-assembled area from which the portion thereof has been removed.

59 Claims, 15 Drawing Sheets

(51) Int. Cl.
*G03F 9/00* (2006.01)
*H01L 21/762* (2006.01)
*B82Y 40/00* (2011.01)

(52) U.S. Cl.
CPC ........ *H01L 21/76224* (2013.01); *B82Y 40/00* (2013.01); *H01L 2223/5442* (2013.01); *H01L 2223/5446* (2013.01); *H01L 2223/54426* (2013.01); *H01L 2924/0002* (2013.01)

(58) Field of Classification Search
CPC ..... H01L 2223/5446; H01L 2223/5442; H01L 2223/54426; G03F 9/708; B82Y 40/00
See application file for complete search history.

(56) References Cited

U.S. PATENT DOCUMENTS

| | | | |
|---|---|---|---|
| 2002/0149122 A1* | 10/2002 | Yamamoto | G03F 9/7076 257/797 |
| 2003/0025890 A1 | 2/2003 | Nishinaga | |
| 2007/0242247 A1 | 10/2007 | Shiraishi | |
| 2009/0153825 A1 | 6/2009 | Edart et al. | |
| 2010/0297847 A1 | 11/2010 | Cheng et al. | |
| 2012/0312501 A1* | 12/2012 | Koole | B82Y 10/00 165/65 |
| 2013/0078576 A1* | 3/2013 | Wu | C08F 293/00 430/325 |

\* cited by examiner

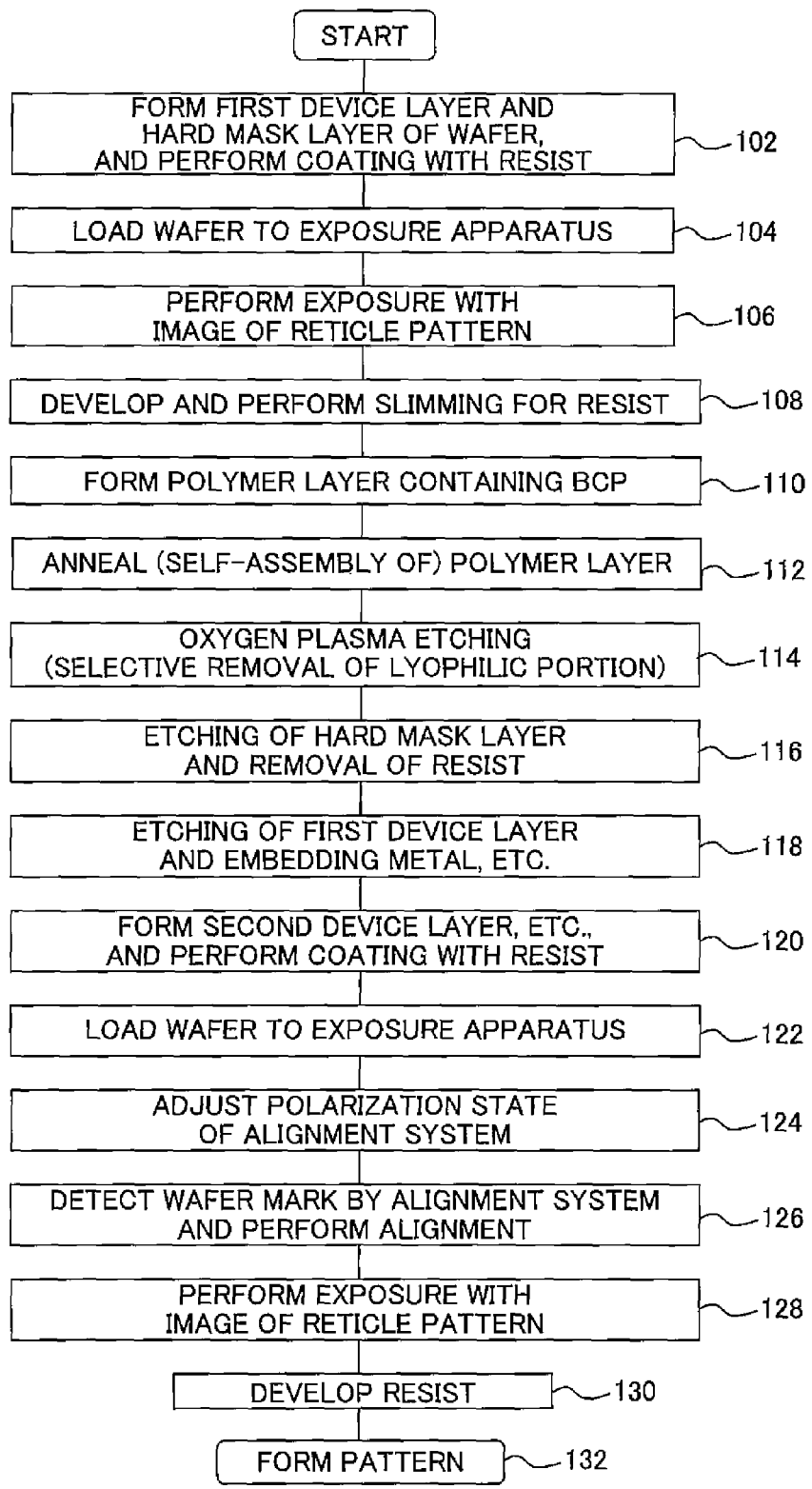

Fig. 10A
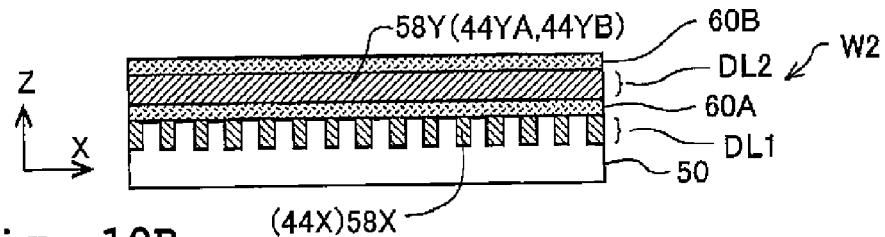
Fig. 10B
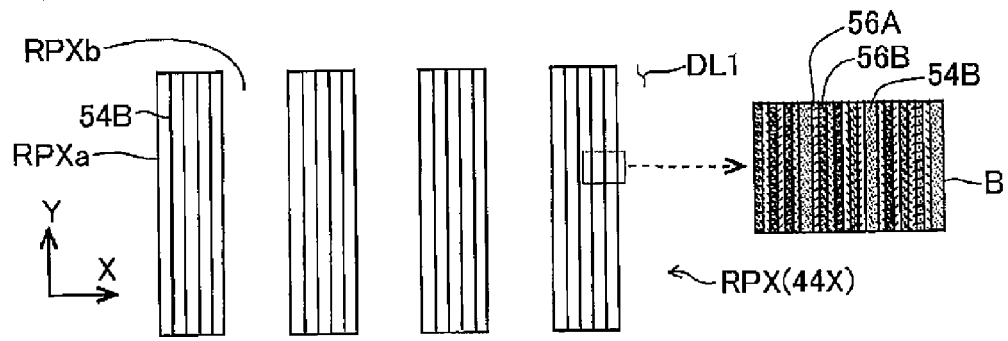
Fig. 10C
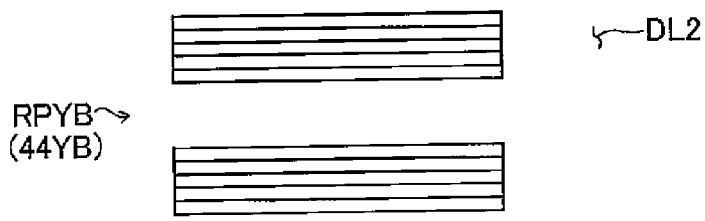
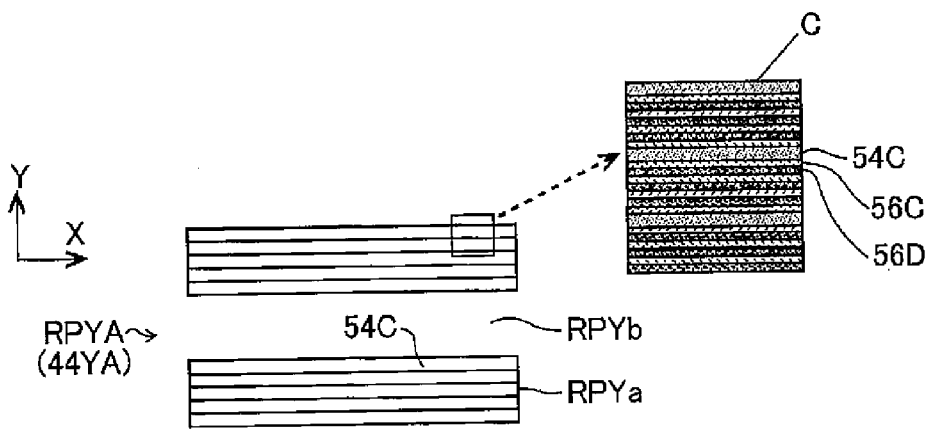

MARK, METHOD FOR FORMING SAME, AND EXPOSURE APPARATUS

CROSS REFERENCE TO RELATED APPLICATION

This application is a continuation application of International Patent Application No. PCT/JP2013/068752 entitled MARK, METHOD FOR FORMING SAME, AND EXPOSURE APPARATUS" and claiming the benefit of priority of Japanese Patent Application No. 2012-154373 filed on Jul. 10, 2012 and the disclosures of Japanese Patent Application No. 2012-154372 and International Patent Application No. PCT/JP2013/068752 are incorporated herein by reference in their entireties.

TECHNICAL FIELD

The present invention relates to a mark formed in a mark formation area of a substrate, a mark forming method for forming the mark, an exposure apparatus using the mark, and a method for producing device using the exposure apparatus.

BACKGROUND ART

A semiconductor device typically includes a plurality of layers of circuit patterns formed on a substrate, and a positioning mark or alignment mark is formed in a mark formation area of a predetermined layer of the substrate so as to accurately align the circuit patterns of the plurality of layers relative to each other, in a production step of the semiconductor device. In a case that the substrate is a semiconductor wafer (hereinafter referred to simply as "wafer"), the alignment mark is referred to also as a "wafer mark".

Conventionally, the minutest circuit pattern of the semiconductor device is formed, for example, with a dry or liquid immersion lithography step using a dry or liquid immersion exposure apparatus of which exposure wavelength is 193 nm. It is expected that formation of a circuit pattern more minute, for example, than a 22 nm node is difficult even by combining the conventional photolithography and the double-patterning process which has been recently developed.

In view of this situation, it has been suggested using the directed self-assembly (directed self-organization) of a block copolymer between patterns formed by using the lithography step so as to generate a minute structure of nano-scale (sub-lithography structure), thereby forming a circuit pattern more minute than the resolution limit of the current lithography technique (see, for example, the specification of U.S. Patent Application Publication No. 2010/0297847 or Japanese Patent Application Laid-open No. 2010-269304). The patterned structure of the block copolymer is also known as a micro domain (micro phase-separated domain) or simply as a domain. The graphoepitaxy is known as a method for generating the directed self-assembly.

SUMMARY

It is possible to form a minute circuit pattern of the nano-scale in a certain layer of the substrate by using the directed self-assembly of the block copolymer. In some cases, it is further required to form an alignment mark in the certain layer, together with the circuit pattern. However, in a case that the alignment mark is merely formed with any conventional method, any unexpected minute structure is formed also in the alignment mark itself due to the self-assembly of the block copolymer; in such a case, if the alignment mark is hard to be detected in a step after the formation step, there is a fear that the overlay accuracy between the layers of the substrate might be lowered.

In view of such a situation, a purpose of an aspect of the present teaching is to provide a mark forming method which is usable when forming a circuit pattern by using the self-assembly of the block copolymer, and to provide a mark formed by the mark forming method.

According to a first aspect of the present teaching, there is provided a mark forming method comprising: forming recessed portion on a mark formation are of a substrate; coating the recessed portion with a polymer layer containing a block copolymer; allowing the polymer layer in the recessed portions to form a self-assembly area; selectively removing a portion of the self-assembly area; and forming a positioning mark by using the self-assembled area from which the portion thereof has been removed.

According to a second aspect of the present teaching, there is provided a mark which is formed in a mark formation area of a substrate, the mark comprising: a plurality of line-pattern areas formed periodically in a first direction; and at least one space-pattern area between the plurality of line-pattern areas, wherein a first structure which is optically unresolvable is formed in the line-pattern areas, a second structure which is optically unresolvable is formed in the space-pattern area, and a periodic direction of the first structure is different from a periodic direction of the second structure.

According to a third aspect of the present teaching, there is provided an exposure apparatus which illuminates a pattern with an exposure light and exposes a substrate with the exposure light via the pattern and a projection optical system, the exposure apparatus including: a mark illumination system configured to illuminate a mark, formed in the substrate, with an illumination light of which polarization state is controllable; a detecting section configured to receive a light from the mark and detect the mark; and a control system configured to control, in a case that a structure unresolvable by the illumination light is included in the mark, the polarization state of the illumination light depending on a periodic direction of the structure.

According to a fourth aspect of the present teaching, there is provided a method for producing a device including: forming, in a substrate, an alignment mark for alignment between layers of the substrate by using the mark forming method of the first aspect of the present teaching; performing the alignment by using the alignment mark and performing exposure for the substrate; and processing the exposed substrate.

According to a fifth aspect of the present teaching, there is provided a method for producing a device, the method comprising: exposing a photosensitive substrate by using the exposure apparatus of the third aspect; and processing the exposed photosensitive substrate.

According to the first aspect of the present teaching, it is possible to form a mark together with a circuit pattern when forming the circuit pattern using the self-assembly of the block copolymer.

Further, the mark of the second aspect can be formed by the mark forming method of the first aspect.

Furthermore, the exposure apparatus of the third aspect can detect a mark formed by the mark forming method of the first aspect.

BRIEF DESCRIPTION OF THE DRAWINGS

FIG. 3 is a flow chart indicating a pattern forming method of a first embodiment.

FIG. 10A is an enlarged cross-sectional view depicting the structure of a plurality of layers of a wafer of a second modification, FIG. 10B is an enlarged plane view depicting a resist mark for a wafer mark of a first device layer of FIG. 10A, and FIG. 10C is an enlarged plane view depicting a resist mark for a wafer mark of a second device layer of FIG. 10A.

EMBODIMENTS

First Embodiment

A preferred first embodiment of the present teaching will be explained with reference to FIGS. 1A to 8. At first, an explanation will be given about an example of a pattern forming system usable for forming a circuit pattern of an electronic device (micro device) such as a semiconductor element, etc., in the embodiment.

Figure 1A:
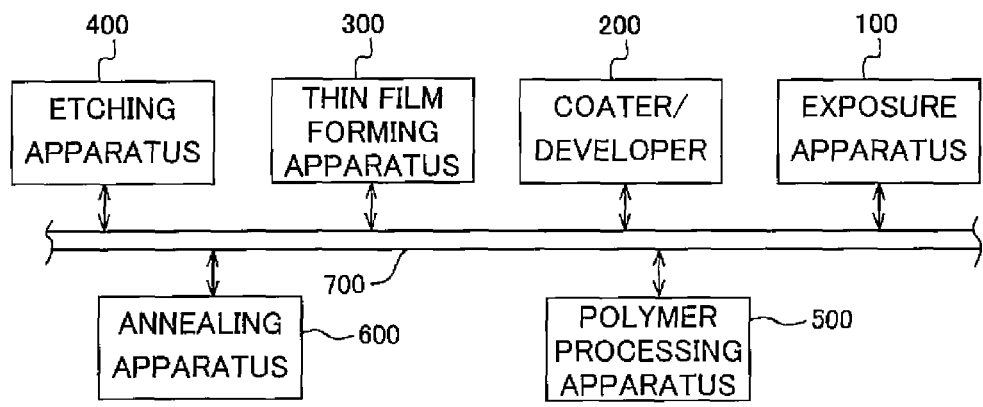
FIG. 1A is a block diagram depicting main parts or portions of a pattern forming system used in an embodiment of the present teaching.
Figure 1B:
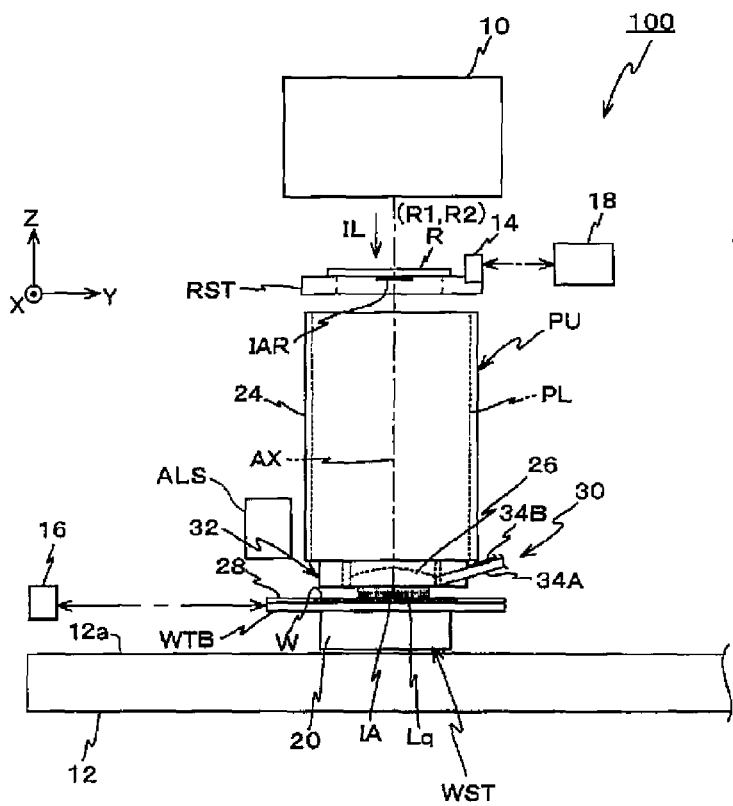
FIG. 1B is a diagram depicting the overall configuration of an exposure apparatus 100 depicted in FIG. 1A.

FIG. 1A depicts the main parts or portions of the pattern forming system of the embodiment, and FIG. 1B depicts the overall configuration of an exposure apparatus 100 depicted in FIG. 1A and which is an exposure apparatus (projection exposure apparatus) of the scanning exposure type constructed of a scanning stepper (scanner). In FIG. 1A, the pattern forming system includes the exposure apparatus 100, a coater/developer 200 which performs coating or application of a photoresist (resist) as a photosensitive material for a wafer (substrate) and which performs the development of the coated (applied) photoresist, a thin film forming apparatus 300, an etching apparatus 400 which performs the dry etching and the wet etching for the wafer, a polymer processing apparatus 500 which performs processing of a polymer containing a block copolymer (BPC) to be described later on, an annealing apparatus 600, a transport system 700 which performs the transport of the wafer among the apparatuses, a host computer (not depicted in the drawings), and the like.

The block copolymer used in the present teaching is a polymer including not less than two monomers each of which is present as a block unit, or a polymer derived from these monomers. Each of the blocks of the monomers includes a repeated sequence of the monomers. As the block copolymer, it is allowable to use any polymer such as diblock copolymer, triblock copolymer, or the like. Among these copolymers, the diblock copolymer has blocks of two different monomers. The diblock copolymer can be abbreviated, for example, as "A-b-B", wherein "A" represents a polymer of a first block, "B" represents a polymer of a second block, and "-b-" indicates that it is a diblock copolymer having the A block and the B block. For example, "PS-b-PMMA" represents a diblock copolymer of polystyrene (PS) and polymethyl methacrylate (PMMA). In addition to a chain block copolymer, it is allowable to use block copolymers having other structures including, for example, a star copolymer, a branched copolymer, a hyper-branched copolymer, or graft copolymer, etc., as the block copolymer of the present teaching.

Further, in the block copolymer, there is such a tendency that the respective blocks (monomers) constructing the block copolymer assemble together to form individual micro phase-separated domains referred to also as "micro domains" or simply as "domains" (tendency to undergo phase separation). The phase separation is a kind of the self-assembly (self-organization). The spacing distance between different domains and the form thereof depend on the interaction between the different blocks in the block copolymer, the volume fraction and number of the different blocks. The domains of the block copolymer can be formed, for example, as a result of annealing. The heating or baking which is a part of the annealing is a general process for raising the temperatures of a substrate and of a coating layer (thin film layer) provided on the substrate to be higher than the ambient temperature. The annealing can include thermal annealing, thermal gradient annealing, solvent vapor annealing or other annealing methods. The thermal annealing is referred to as heat curing (thermal curing) in some cases, and used to induce the phase separation. The thermal annealing can be used also as a process for reducing or removing any defect inside a layer of lateral micro phase-separated domains. The annealing generally includes a process for perform heating at a temperature higher than the glasstransition temperature of the block copolymer for a certain period of time (for example, several minutes to several days).

Further, in the embodiment, the directed self-assembly (DSA) is applied to a polymer containing a block copolymer so as to allow the polymer containing the block copolymer to foul' domains of nano-scale order which are segmented in a suitable shape for the formation of a circuit pattern and/or an alignment mark of a semiconductor device. The directed self-assembly is a technique in which a pattern of resist (resist pattern) formed, for example, in a lithography step is used as a pre-pattern or guide pattern, and the arrangement of domains of the block copolymer is controlled based on a spatial arrangement (topographic structure) defined by the pre-pattern or guide pattern. As a method of generating or causing the directed self-assembly, it is possible to use, for example, the grapho-epitaxy process which uses a three-dimensional pre-pattern or guide pattern. However, it is also possible to use the chemo-epitaxy process wherein a planar pre-pattern or guide pattern is provided on a base layer.

In FIG. 1B, the exposure apparatus 100 is provided with an illumination system 10; a reticle stage RST which holds a reticle R (mask) illuminated with illumination light or illumination light beam for the exposure (exposure light) IL from the illumination system 10; a projection unit PU including a projection optical system PL which projects the illumination light IL allowed to exit (exiting) from the reticle R onto a surface of a wafer W (substrate); a wafer stage WST which holds the wafer W; and a main controller 38 (see FIG. 1C) constructed of a computer controlling the entire operations of the exposure apparatus. In the following, an explanation will be given in FIG. 1B with the Z-axis being taken in parallel to an optical axis AX of the projection optical system PL, the Y axis being taken along a direction in which the reticle R and the wafer W are scanned relative to each other in a plane perpendicular to the Z axis (plane substantially parallel to a horizontal plane), the X-axis being taken along a direction orthogonal to the Z-axis and the Y-axis, and directions of rotation (inclination) about the X axis, the Y axis, and the Z axis being designated as θx, θy, and θz directions respectively.

The illumination system 10 includes, as disclosed for example in the specification of United States Patent Application Publication No. US 2003/025890, etc., a light source which generates the illumination light IL and an illumination optical system which illuminates the reticle R with the illumination light IL. The ArF excimer laser beam (wavelength: 193 nm) is used as an example of the illumination light IL. It is also possible to use, as the illumination light IL, the KrF excimer laser beam (wavelength: 248 nm), the high harmonic wave such as the YAG laser or the solid-state laser (for example, the semiconductor laser).

The illumination optical system includes: a polarization controlling optical system; a light amount distribution forming optical system (a diffraction optical element or a spatial light modulator, etc.); an illuminance uniformizing optical system including an optical integrator (such as, fly-eye lens or rod integrator (inner-reflection integrator)), etc.; a reticle blind (a fixed or variable field stop) (all of the above are not depicted in the drawings); and the like. The illumination system 10 illuminates a slit-shaped illumination area IAR which is disposed on a pattern surface (lower surface), of the reticle R, defined by the reticle blind and which is elongated in the X direction, with the illumination light IL in a predetermined polarization state at a substantially uniform illuminance distribution, under an illumination condition such as the dipole illumination (including a so-called leaf illumination in which the shape of a secondary light source is elongated in a leaf-like shape in a non-periodic direction of the pattern), quadrupole illumination, annular (zonal) illumination, or a normal illumination, etc.

The reticle stage RST holds (retains) the reticle R thereon by the vacuum attraction etc. The reticle stage RST is placed on the upper surface of an unillustrated reticle base (surface parallel to the XY plane) so that the reticle stage RST is movable in Y direction at a constant speed and the positions of the reticle stage RST in the X and Y directions and the rotational angle of the reticle stage RST in the θz direction are adjustable. The position information of the reticle stage RST is always detected at a resolution of, for example, about 0.5 nm to about 0.1 nm via a movement mirror 14 (or a mirror-finished side surface of the stage) by a reticle interferometer 18 including a multi-axis laser interferometer. A reticle stage driving system (not depicted in the drawings) including a linear motor, etc. is controlled based on a measured value by the reticle interferometer 18, to thereby control the position and the velocity of the reticle stage RST.

Further, the projection unit PU arranged at a position below or under the reticle stage RST is provided with a barrel 24, and the projection optical system PL including a plurality of optical elements which are held in a predetermined positional relationship inside the barrel 24. The projection optical system PL is, for example, telecentric on the both sides and has a predetermined projection magnification β (for example, reduction magnification such as ¼, ⅕, etc.). An image of the circuit pattern in the illumination area IAR of the reticle R is formed, via the projection optical system PL, in an exposure area IA (area conjugated with the illumination area IAR) inside one shot area among the shot areas of the wafer W by the illumination light IL allowed to pass through the reticle R. The wafer W (semiconductor wafer) as the substrate in the embodiment includes, for example, a substrate constructed of a disk-shaped base member having a diameter in a range of about 200 mm to about 450 mm and composed of, for example, silicon or SOI (silicon on insulator) etc., wherein a thin film for pattern formation (oxide film, metal film, polysilicon film, etc.) is formed on a surface of the base member. Further, a photoresist is applied (coated) on a surface of the wafer as an object to be exposed (exposure target) to provide a predetermined thickness (for example, about several tens of nm to about 200 nm).

Furthermore, for the purpose of performing the exposure to which the liquid immersion method is applied, the exposure apparatus 100 is provided with a nozzle unit 32, which constructs a part or portion of a local liquid immersion device 30, so as to surround an lower end portion of the barrel 24 holding an end-portion lens 26 which is included in the plurality of optical elements constructing the projection optical system PL and which is an optical element closest to the image plane side (closest to the wafer W side), the local liquid immersion device 30 being a device to supply a liquid Lq between the end-portion lens 26 and the wafer W. A supply port for the liquid Lq of the nozzle unit 32 is connected to a liquid supply device (not depicted) via a supply flow passage and a supply tube 34A. A recovery port for the liquid Lq of the nozzle unit 32 is connected to a liquid recovery device (not depicted) via a recovery flow passage and a recovery tube 34B. The detailed configuration of the local liquid immersion device 30 is disclosed, for example, in the specification of United States Patent Application Publication No. US 2007/242247.

Moreover, the wafer stage WST is placed on an upper surface 12a, of a base plate 12, which is parallel to the XY plane such that the wafer stage WST is movable in the X and Y directions. The wafer stage WST includes a body 20 of the wafer stage (stage body 20); a wafer table WTB arranged on the upper surface of the stage body 20; and a Z-leveling mechanism (not depicted in the drawing) which is provided inside the stage body 20 and which drives the wafer table WTB such that the position in the Z direction (Z position) and the tilt angles in the θx and θy directions of the wafer table WTB (wafer W) relative to the stage body 20 are changed. A wafer holder (not depicted), which holds the wafer W for example by the vacuum attraction, etc. on a suction surface approximately parallel to the XY plane, is provided on the wafer table WTB. A flat-shaped plate (water-repellent plate) 28, having a surface which is subjected to the liquid-repellent treatment for the liquid Lq, is provided on a portion of the upper surface of the wafer table WTB, the portion surrounding the wafer holder (wafer W); the surface of the water-repellent plate 28 is provided to be approximately flush with the surface of the wafer W (wafer surface) placed on the wafer holder. Further, during the exposure, the Z-levelling mechanism of the wafer stage WST is driven based on a measured value by, for example, an autofocus sensor of the oblique incident system (not depicted in the drawings) so that the wafer surface is matched (focused on) the image plane of the projection optical system PL during the exposure.

Furthermore, reflection surfaces are formed by performing mirror-finish for end surfaces in the Y and X directions of the wafer table WTB, respectively. The position information (including at least the positions in the X and Y directions and the rotational angle in the Oz direction) of the wafer stage WST is measured at a resolution of, for example, about 0.5 nm to about 0.1 nm by projecting interferometer beams to the reflection surfaces, respectively (may be to a movement mirror) from a multi-axis laser interferometer constructing a wafer interferometer 16. A wafer stage driving system including a linear motor, etc. (not depicted in the drawings) is controlled based on a measured value of the measurement, to thereby control the position and the velocity of the wafer stage WST. Note that the position information of the wafer stage WST may be measured with a detection device of an encoder system provided with a scale of diffraction grating type and a detection head.

Moreover, the exposure apparatus 100 is provided with a wafer alignment system ALS which measures the position of a predetermined wafer mark (alignment mark) of the wafer W, and a spatial image measuring system (not depicted in the drawings) which is contained in the wafer stage WST in order to measure the position of an image of an alignment mark of the reticle R formed by the projection optical system PL. The alignment is performed for the reticle R and the respective shot areas of the wafer W by using the spatial image measuring system (reticle alignment system) and the wafer alignment system ALS.

Figure 1C:
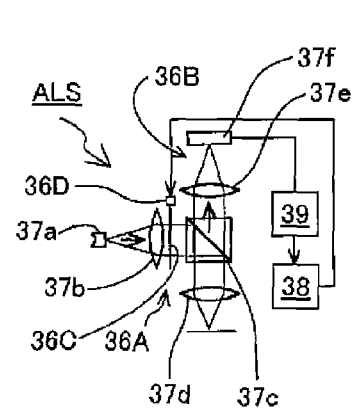
FIG. 1C is a diagram depicting a wafer alignment system of FIG. 1B.

As depicted in FIG. 1C, the wafer alignment system ALS has: a mark illumination system 36A which illuminates a mark to be detected (target mark) with, for example, a non-polarized detection light in a relatively broad range from the visible range to the near infrared range; a detection system 36B which collects a reflected light from the target mark and forms an enlarged image of the target mark and which takes the enlarged image; a polarizing plate 36C which is capable of setting the polarization state of the detection light to be irradiated onto the target mark to a linearly polarized light; a driving section 36D which can insert/retract the polarization plate 36C to/from the optical path of the detection light and which can control the angle of the polarization plate 36C in a range of 0 degrees to 180 degrees; and a signal processing section 39 which detects the position of the target mark based on an imaging signal supplied from the detection system 36B.

The mark illumination system 36A has: a light guide 37a which transmits (guides), for example, a light from a light source (not depicted in the drawings); a condenser lens 37b which shapes the detection light exited from the light guide 37a into a parallel light beam; a half mirror 37c which reflects the detection light toward the target mark; and a first objective lens 37d which focuses the detection light to an observation area including the target mark. The detection section 36B has the first objective lens 37d and a second objective lens 37e which collect the reflected light from the target mark and form an image of the target mark, the half mirror 37c arranged between the first and second objective lenses 37d and 37e, and a two-dimensional imaging element 37f of the CCD or CMOS type which takes an image of the target mark. In a case that the detection light is set to be a linearly polarized light in a direction according to the structure, etc. of the target mark, the driving section 36D arranges the polarizing plate 36C, as an example, between the condenser lens 37b and the half mirror 37c under the control of the main controller 38, and further controls the rotational angle of the polarization plate 36C.

In FIG. 1B, when performing exposure of the wafer W, a shot area of the wafer W as the exposure target is moved beside the exposure area IA by the movement (step movement) of the wafer stage WST in the X direction and the Y direction. Further, the liquid Lq is supplied from the local liquid immersion device 30 to a space between the projection optical system PL and the wafer W. An image of a part of the pattern of the reticle R, which is formed by the projection optical system PL, is projected onto a certain shot area among the shot areas of the wafer W, while the reticle R and the wafer W are moved synchronously in the Y direction via the reticle stage RST and the wafer stage WST. By doing so, the certain shot area is subjected to the scanning exposure with the image of the pattern of the reticle R. The step movement and the scanning exposure are repeated, and thus each of the shot areas of the wafer W is exposed with the image of the pattern of the reticle R in the step-and-scan manner and the liquid immersion manner.

Next, a pattern for device (device pattern) as an object to be produced (production target) in the embodiment is, as an example, a circuit pattern for a gate cell of a static RAM (SRAM) as a semiconductor element. The circuit pattern is formed by using the directed self-assembly (DSA) of a polymer containing a block copolymer. Further, in the embodiment, a wafer mark as an alignment mark for positioning or alignment is also formed in a device layer of a wafer W in which the device pattern is formed.

Figure 2A:
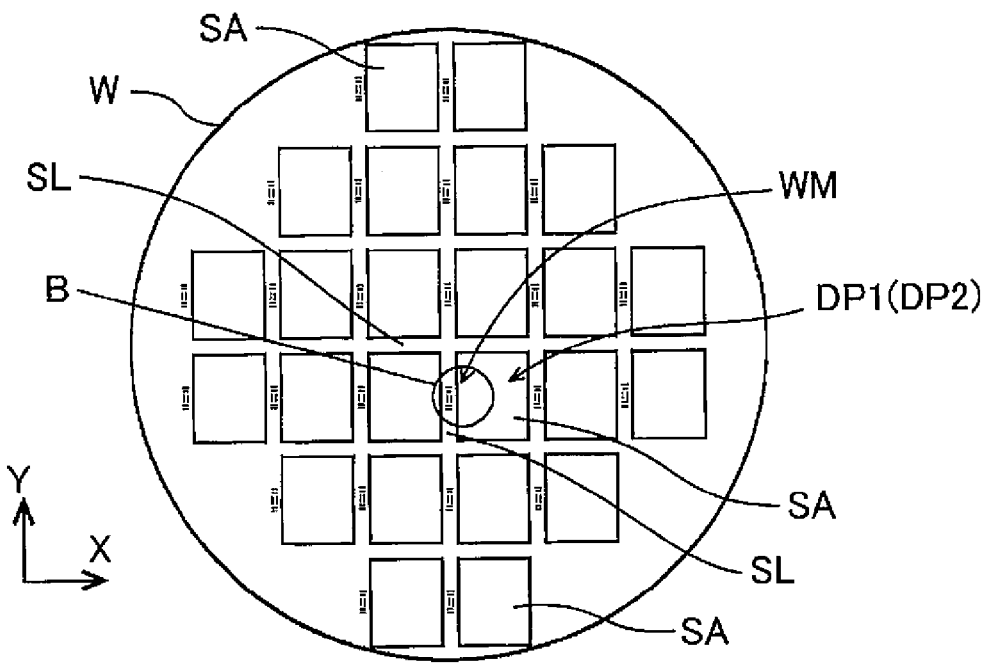
FIG. 2A is a plane view depicting a certain device layer of a wafer of a first embodiment.

FIG. 2A depicts a wafer W in which the device pattern and the wafer mark are formed. In FIG. 2A, a large number of shot areas SA (device pattern formation areas) are provided on the surface of the wafer W in a state that scribe line areas SL (mark formation areas) having predetermined widths are intervened between the shot areas SA in the X and Y directions; a device pattern DP1 is formed inside each of the shot areas SA, and a wafer mark WM is formed in each of the scribe line areas SL provided adjacent to one of the shot areas SA.

Figure 2B:
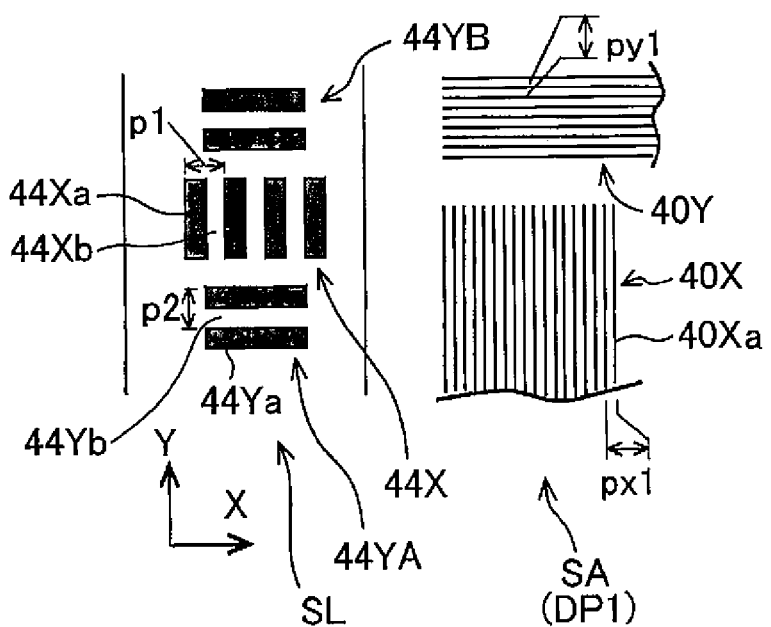
FIG. 2B is an enlarged plane view depicting one of wafer marks and a part of a circuit pattern of FIG. 2A.

As depicted in FIG. 2B which is an enlarged view of portion B in FIG. 2A, the device pattern DP1 includes a line-and-space pattern (hereinafter referred to as "L & S pattern") 40X in which a plurality of line patterns 40Xa extending in the Y direction are arranged in the X direction substantially at a period (pitch) px1 and a L & S pattern 40Y in which a plurality of line patterns extending in the X direction are arranged in the Y direction substantially at a period py1. The line pattern 40Xa, etc., are each formed, for example, of a metal, and the line width thereof is about not more than ½ times (half) the period px1, etc. As an example, the period px1 is substantially same as the period py1, and the period px1, etc., are each about one severalth of the minutest period (hereinafter referred to as "period pmin") which can be obtained in a process in which the liquid immersion lithography using a wavelength of 193 nm and, for example, a so-called double patterning process are combined. The value half (the value ½ times) the period px1 is smaller than, for example, about 22 nm. In a case of forming the L & S patterns 40X and 40Y having such a minute period, a linear domain is formed in each of different blocks when the polymer containing the block copolymer is allowed to undergo the directed self-assembly.

Further, the wafer mark WM in each of the scribe line areas SL includes a X-axis wafer mark 44X in which a line-pattern area 44Xa and a space-pattern area 44Xb each elongated in the Y direction and having substantially same widths in the X direction are arranged in the X direction at a period p1, and Y-axis wafer marks 44YA, 44YB which are disposed on two locations, and in each of which a line-pattern area 44Ya and a space-pattern area 44Yb each elongated in the X direction and having substantially same widths in the Y direction are arranged in the Y direction at a period p2. The wafer marks 44YA and 44YB are arranged to sandwich the wafer mark 44X therebetween in the Y direction. As an example, the periods p1 and p2 are identical, and the period p1 is several times to several ten times the resolution limit (period) in the liquid immersion lithography having the wavelength of 193 nm.

Further, the line-pattern areas 44Xa, 44Ya and the space-pattern areas 44Xb, 44YB may be areas different in the reflectivity with respect to a detection light in case of performing detection with the wafer alignment system ALS depicted in FIG. 1B. In this case, the resolution limit of the wafer alignment system ALS (the limit of optical detection performable by the wafer alignment system ALS) is expressed as $\lambda a/(2NA)$, using the wavelength $\lambda a$ of the detection light of the wafer alignment system ALS and the numerical aperture NA of an objective optical system. Furthermore, for detecting the wafer marks 44X, 44YA and 44YB by the wafer alignment system ALS, it is required that the value corresponding to ½ of the period p1 of the wafer mark 44X is not less than the resolution limit of the wafer alignment system ALS, and the condition under which the wafer marks 44X, 44YA and 44YB can be detected by the wafer alignment system ALS is as follows:

$$p1/2 \geq \lambda a/(2NA) \quad (1)$$

As an example, provided that the wavelength $\lambda a$ is 600 nm, the numerical aperture NA is 0.9, then the period p1 may be about not less than 670 nm. In the embodiment, since the directed self-assembly by which linear domains are formed during formation of the device pattern DP1 is applied, it is necessary to take into the consideration the fact that the linear domains are formed by the directed self-assembly of the block copolymer also during the formation of the wafer mark 44X, etc.

Figure 4A:
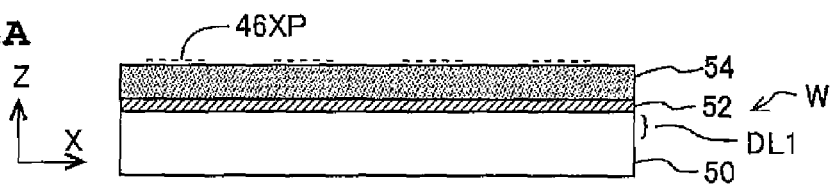
FIGS. 4A, 4B, 4C, 4D, 4E, 4F, 4G and 4H are enlarged cross-sectional views each depicting a portion of a pattern of a wafer gradually changing during a pattern forming step.
Figure 4B:
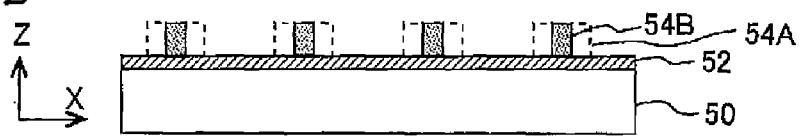
Figure 4C:
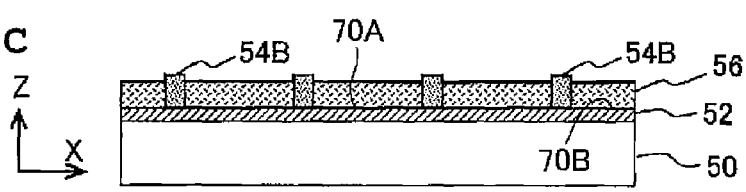

In the following, an explanation will be given about an example of a pattern forming method for forming the wafer marks 44X and 44YB depicted in FIG. 2B by using the pattern forming system of the embodiment, with reference to a flow chart indicated in FIG. 3. Note that the device pattern DP1 and the wafer mark 44YA are also formed together with the wafer marks 44X and 44YB. As an example, as depicted in FIG. 4A, a surface portion of a base member 50, of the wafer W, formed for example of silicon is a first device layer DL1 in which the wafer mark and device pattern are to be formed.

At first, in Step 102 of FIG. 3, the thin film forming apparatus 300 is used to form a hard mask layer 52 such as an oxide film or a nitride film on the surface of the device layer DL1 of the wafer W. Further, it is preferred to form a neutral layer (not depicted in the drawings) on the hard mask layer 52 so that a polymer layer containing a block copolymer (to be described later on) has affinity with the hard mask layer 52 (is easily attachable to the hard mask layer 52). Further, the coater/developer 200 is used so as to perform coating on the hard mask layer 52 or the neutral layer with, for example, a positive resist layer 54 (see FIG. 4A). Note that it is allowable to use a bottom anti-reflection coating (BARC) as the hard mask layer 52. Further, the illumination condition of the exposure apparatus 100 is set, for example, to the quadrupole illumination so that the minutest pattern can be exposed in the X and Y directions, and the wafer W is loaded onto the exposure apparatus 100 (Step 104). Then, each of the shot areas SA of the wafer W is exposed with an image of the device pattern (device pattern image; not depicted in the drawings) of the reticle R1 by the liquid immersion method. At the same time as the exposure is performed for each of the shot areas SA, the scribe line area SL provided adjacent to each of the shot areas SA is exposed with an image 46XP, etc. of the pattern of the wafer mark (wafer mark pattern image 46XP, etc.) of the reticle R1 (Step 106). The wafer for which the exposure has been performed is unloaded from the exposure apparatus 100, and the resist is developed at the coater/developer 200 so as to form a resist pattern 54A (see FIG. 4B) thereon. Afterwards, the slimming and resist curing processing are performed for the resist pattern 54A (Step 108). Note that during the exposure of the pattern image of the reticle R1, it is also possible to adjust the exposure amount to be great so that the line width of the resist pattern becomes narrow. In such a case, the slimming can be omitted.

Figure 5A:
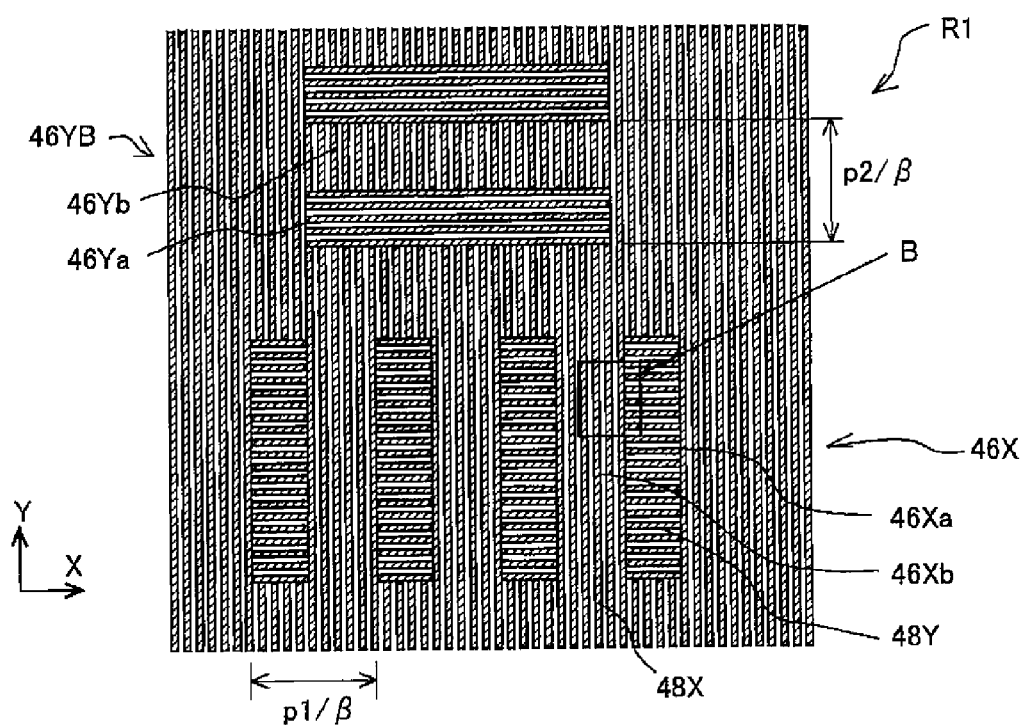
FIG. 5A is an enlarged plane view depicting a portion of a mark pattern of a reticle.

As depicted in FIG. 5A, a pattern area corresponding to each of the scribe line areas SL of the reticle R1 is formed with the X-axis mark pattern 46X and the Y-axis mark pattern 46YB that are the original of the wafer mark. The mark pattern 46X and the mark pattern 46YB are constructed by arranging a line area 46Xa corresponding to the line-pattern area 44Xa of FIG. 2B and a line area 46Ya corresponding to the line-pattern area 44Ya of FIG. 2B in the X direction and the Y direction, respectively and by arranging a space area 46Xb corresponding to the space-pattern area 44Xb of FIG. 2B and a space area 46Yb corresponding to the space-pattern area 44Yb of FIG. 2B in the X direction and the Y direction, respectively, at a period p1/β and a period p2/β (β is the projection magnification). The width of the line areas 46Xa and 46Ya and the width of the space areas 46Xb and 46Yb are substantially same. For the convenience of the following explanation, an image of the reticle pattern by the projection optical system PL is an erected image.

Figure 5B:
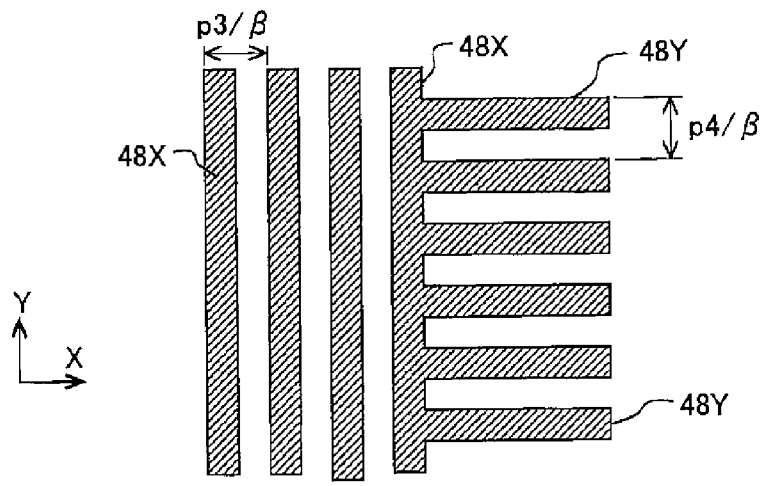
FIG. 5B is an enlarged plane view depicting a "B" portion in FIG. 5A.

A plurality of line patterns 48Y is formed in each of the line areas 46Xa and 46Ya. The line patterns 48Y are each formed of a light-shielding film elongated in the X direction while having a light-transparent portion as the background thereof, and are arranged in the Y direction at a period p4/β (see FIG. 5B which is an enlarged view of a "B" portion of FIG. 5A). A plurality of line patterns 48X is formed in each of the space areas 46Xb and 46Yb (here, the areas surrounding the line areas 46Xa and 46Ya, respectively). The line patterns 48X are each formed of a light-shielding film elongated in the Y direction and are arranged in the X direction at a period p3/β (see FIG. 5B). As depicted in FIG. 5B, end portions in the longitudinal direction of the line patterns 48Y in the line area 46Xa are connected to an edge portion in the width direction of one line pattern 48X, among the line patterns 48X, which is located at an end portion of the space area 46Xb.

The line width of the line pattern 48X is ½ times the period p3/β corresponding thereto and the line width of the line pattern 48Y is ½ times the period p4/β corresponding thereto. In the embodiment, the period p4/β is same as the period p3/β; and the period p3/β is substantially same as the resolution limit on the object plane side of the projection optical system PL of the exposure apparatus 100 (resolution limit of the liquid immersion lithography using the wavelength of 193 nm). It is allowable, however, that the period p3/β is about slightly greater than the resolution limit. Accordingly, the images 46XP, etc. of the mark patterns 46X and 46YB (combination of the line patterns 48X and the line patterns 48Y) of the reticle R1 are exposed to the scribe line area SL of the wafer W, by the exposure apparatus 100 with high precision.

Figure 6A:
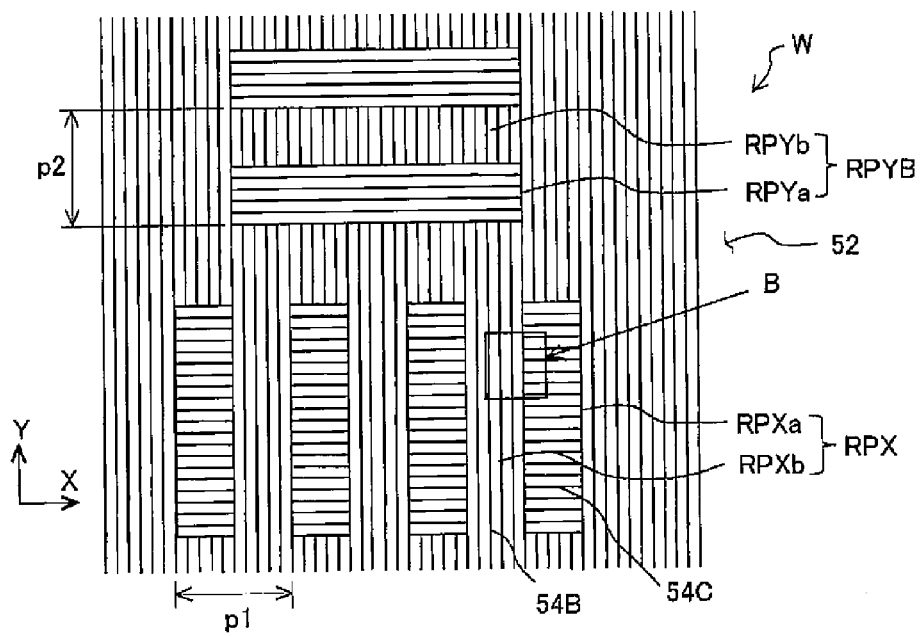
FIG. 6A is an enlarged plane view depicting a portion of a resist pattern formed on a surface of a wafer.
Figure 6B:
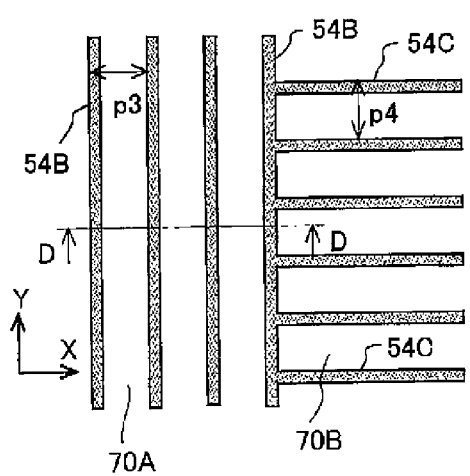
FIGS. 6B and 6C are enlarged plane views depicting a pattern of the "B" portion in FIG. 6A in different production steps, respectively.
Figure 6C:
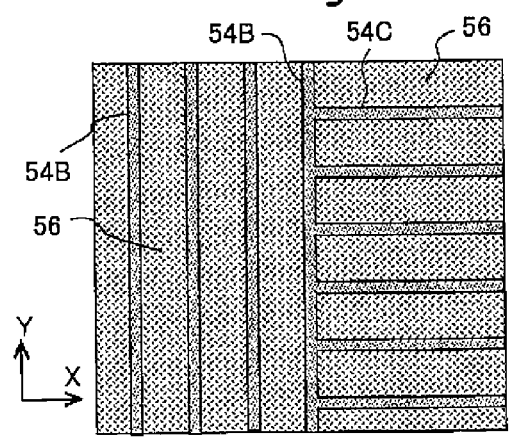

FIG. 6A depicts an X-axis resist mark RPX and an Y-axis resist mark RPYB each of which is composed of a resist pattern that is formed on the hard mask layer 52 of the wafer W after the exposure of the image of the mark patterns 46X and 46YB of the reticle R1 of FIG. 5A to the resist layer 54, the development and the slimming therefor. In FIG. 6A the resist mark RPX is constructed by arranging line-group area RPXa corresponding to the line area 46Xa of the reticle R1 of FIG. 5A and space area RPXb corresponding to the space area 46Xb of the reticle R1 of FIG. 5A in the X direction at the period p1, and the resist mark RPYB is constructed by arranging line-group area RPYa corresponding to the line area 46Ya of the reticle R1 of FIG. 5A and space area RPYb corresponding to the space area 46YB of the reticle R1 of FIG. 5A in Y direction at the period p2. Further, FIG. 6B is an enlarged view depicting a "B" portion in FIG. 6A, and FIG. 6C and FIGS. 7A to 7C are each an enlarged view depicting a portion corresponding to the "B" portion in FIG. 6A.

A plurality of linear patterns 54B is formed in each of the space areas RPXb and RPYb (here, the areas surrounding the line areas RPXa, RPYa, respectively). The linear patterns 54B (hereinafter referred to as the "guide patterns 54W") are each elongated in the Y direction, and are arranged in the X direction at the period p3 (see FIG. 6B). A plurality of linear patterns 54C is formed in each of the line areas RPXa and RPYa. The linear patterns 54C (hereinafter referred to as the "guide patterns 54C") are each elongated in the X direction, and are arranged in the Y direction at the period p4 (here, the period p4 is same as the period p3). The line widths of the guide patterns 54B and 54C are each, for example, about one severalth to about one several tenths of the period p3 (here, a period converted score of the resolution limit of the liquid immersion lithography having the wavelength of 193 nm) (see FIG. 4B). As depicted in FIG. 6B, end portions in the longitudinal direction of the guide patterns 54C in the line area RPXa are connected to an edge portion in the width direction of one guide pattern 54B, among the guide patterns 54B, which is located at an end portion of the space area RPXb. Owing to this configuration, the structures of the resist marks RPX and RPYB become resilient even after narrowing the line width of the resist pattern by the slimming, etc., thereby making it possible to suppress any collapse, etc. of the guide patterns 54B and 54C constructing the resist marks RPX and RPYB in a latter-stage processing or downstream operation. Note that FIGS. 4A to 4H are each a cross-sectional view depicting a potion corresponding to a portion along a line D-D in FIG. 6B.

Then, in Step 110, the wafer W in which the resist marks RPX and RPYB depicted in FIG. 6A have been formed is transported to the polymer processing apparatus 500, and a polymer layer 56 containing a block copolymer (BCP) is formed (applied) on the wafer W (the wafer W is coated with the polymer layer 56 containing the BCP) by, for example, the spin coating so that the polymer layer 56 covers the resist marks RPX and RPYB and a resist pattern (not depicted) for forming the device pattern on the wafer W. In the embodiment, as an example, diblock copolymer (PS-b-PMMA) of polystyrene (PS) and polymethyl methacrylate (PMMA) is used as the block copolymer. Further, although the polymer layer 56 is the block copolymer itself, the polymer layer 56 may contain a solvent for increasing the coating property and/or an additive for facilitating the self-assembly, etc. By the spin coating, the polymer layer 56 is deposited in recessed portions 70A and 70B between the protruded guide patterns 54B and 54C respectively, constructing the resist marks RPX and RPYB (see FIGS. 4B, 4C and 6C).

Figure 4D:
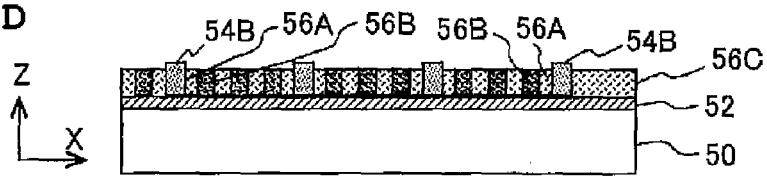
Figure 7A:
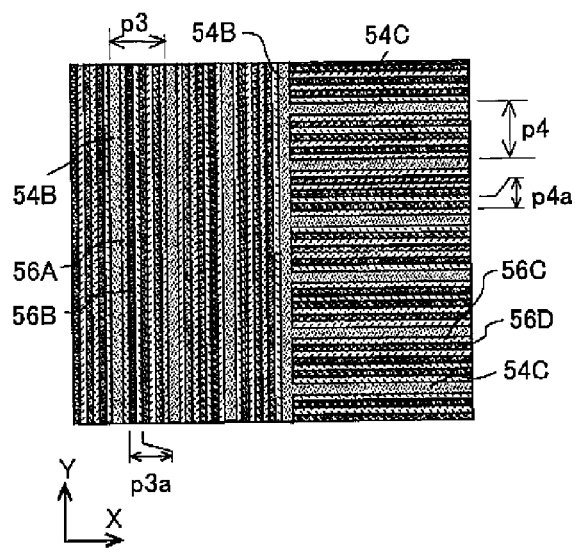
FIGS. 7A, 7B and 7C are enlarged plane views depicting the pattern of the "B" portion in FIG. 6A in different production steps, respectively.

Then, the wafer W having the polymer layer 56 formed thereon is transported to the annealing apparatus 600, and annealing (for example, thermal annealing) is performed for the polymer layer 56 to thereby allow the polymer layer 56 to separate into two kinds of domains by the directed self-assembly (DSA) (Step 112). By the directed self-assembly in this process, the polymer layer 56 between the guide patterns 54B elongated in the Y direction undergoes the phase separation, as depicted in FIGS. 7A and 4D, into a lyophilic first domain 56A composed of linear PMMA (polymethyl methacrylate) elongated in the Y direction and a liquid-repellent second domain 56B composed of linear PS (polystyrene) elongated in the Y direction, in a state that the lyophilic first domain 56A and the liquid-repellent second domain 56B are periodically arranged in the X direction at a period p3a. Since the guide pattern 54B (resist pattern) is lyophilic, the lyophilic domains 56A are formed each in a portion adjacent to the guide pattern 54B. The period p3a is, for example, about one severalth to about one tenth of the period p3 of the guide patterns 54B, and the widths in the X direction of the two kinds of domains 56A and 56B are substantially same with each other.

Further, the polymer layer 56 between the guide patterns 54C elongated in the X direction undergoes the phase separation into a lyophilic third domain 56C composed of linear PMMA elongated in the X direction and a liquid-repellent fourth domain 56D composed of linear PS elongated in the X direction, in a state that the lyophilic third domain 56C and the liquid-repellent fourth domain 56D are periodically arranged in the Y direction at a period p4a. In the embodiment, the period p4 in the Y direction of the guide patterns 54C is same as the period p3 of the guide patterns 54B, and the period p4a of the domains 56C and 56D are substantially same as the period p3a of the domains 56A and 56B. The periods p3a and p4a are substantially same as the periods px1 and py1 of the L & S patterns 40X and 40Y formed in the shot area SA depicted in FIG. 2B. In the embodiment, the polymer layer 56 separates into the two kinds of domains elongated along each of the elongated guide patterns 54B and 54C. During the separation, a condition under which the polymer layer 56 easily separates into the two kinds of elongated domains is used also regarding the annealing of the polymer layer 56 (wafer W).

Figure 4E:
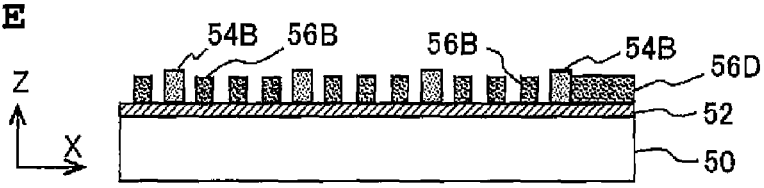
Figure 4F:
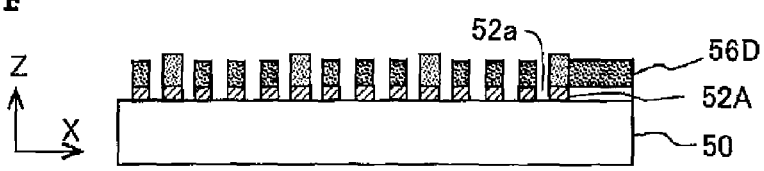
Figure 4G:
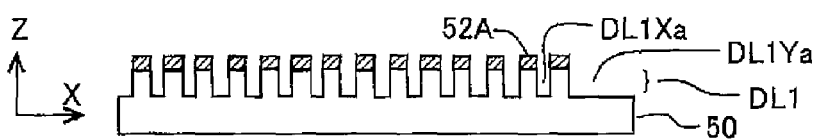
Figure 4H:
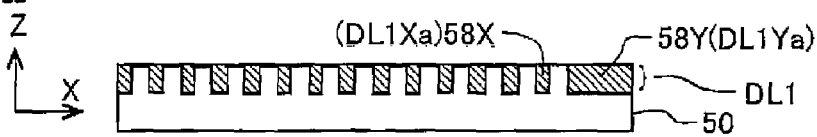
Figure 7B:
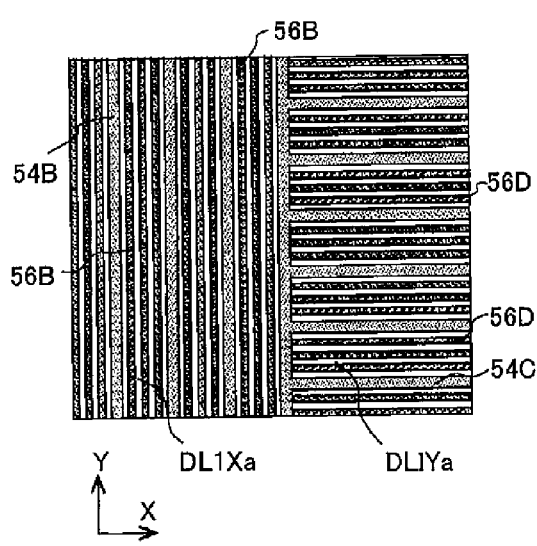
Figure 7C:
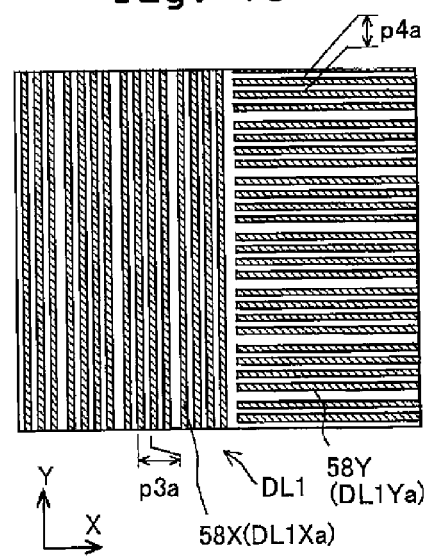

Afterwards, the wafer W is transported to the etching apparatus 400 and, for example, oxygen plasma etching is performed for the wafer W so as to selectively remove the lyophilic first and third domains 56A and 56C among the domains 56A to 56D formed in the wafer W, as depicted in FIGS. 7B and 4E (Step 114). Further, etching is performed for the hard mask layer 52 of the wafer W, with the resist marks RPX and RPYB (guide patterns 54B and 54C) and the liquid-repellent domains 56B and 56D allowed to periodically remain as a mask, so as to form a plurality of openings 52a in the hard mask layer 52 (see FIG. 4F), and the remaining resist and the domains 56B and 56D are removed (Step 116). Further, the etching is performed for the first device layer DL1 of the wafer W, via the hard mask layer 52 in which the openings 52a are formed, so as to form a plurality of recessed portions DL1Xa elongated in the Y direction in the first device layer DL1 at areas corresponding to the plurality of domains 56A, respectively and to form a plurality of recessed portions DL1Ya elongated in the X direction in the first device layer DL1 at areas corresponding to the plurality of domains 56C, respectively, as depicted in FIG. 4G (first half of Step 118). Then, the wafer W is transported to the thin film forming apparatus 300, and by embedding a metal (for example, copper) into the recessed portions DL1Xa and the recessed portions DL1Ya of the device layer DL1 of the wafer W, to thereby form line patterns 58X and 58Y elongated in the Y direction and the X direction, respectively, as depicted in FIG. 4H (second half of Step 118). As depicted in FIG. 7C, the period in the X direction of the line patterns 58X is the period p3a, and the period in the Y direction of the line patterns 58Y is the period p4a (here, the period p4a is same as the period p3a). The line width of each of the line patterns 58X and 58Y is a value substantially corresponding to ½ of the period p3a.

By the steps as described above, as depicted in FIG. 8, an X-axis wafer mark 44X, in which the line-pattern area 44Xa having the plurality of metallic line patterns 58X arranged therein in the X direction substantially at the period p3a and the space-pattern area 44Xb having the plurality of metallic line patterns 58Y arranged therein in the Y direction substantially at the period p4a are periodically arranged in X direction at the period p1, is formed in the scribe line area SL of the device layer DL1 of the wafer W. Further, Y-axis wafer marks 44YA, 44YB which are disposed on two locations are arranged in the Y direction so that the X-axis wafer mark 44X is sandwiched between the Y-axis wafer marks 44YA and 44YB in the Y direction; in each of the Y-axis wafer marks 44YA, 44YB, the line-pattern area 44Ya having the line patterns 58X (shorter than those in the wafer mark 44X) arranged therein in the X direction substantially at the period p3a and the space-pattern area 44Yb having the line patterns 58Y (longer than those in the wafer mark 44X) arranged therein in the Y direction substantially at the period p4a are periodically arranged at the period p2 (here, the period p2 is same as the period p1).

In the embodiment, provided that a period converted score of the resolution limit (size limit which can be optically detected by using a detection light from the visible range to the near-infrared range) of the wafer alignment system ALS provided with the exposure apparatus 100 is "Re(det)" and a period converted score of the resolution limit of the liquid immersion lithography using the wavelength of 193 nm is "Re(exp)", then the period p1 of the line-pattern area 44Xa and the space-pattern area 44Xb of the wafer mark 44X, the resolution limit Re(det), the resolution limit Re(exp) and the period p3a of the line patterns 58X and 58Y constructing the line-pattern are 44Xa and space-pattern area 44Xb have the following relationship:

$$p1 \geq Re(det) > Re(exp) > p3a \qquad (2)$$

Figure 8:
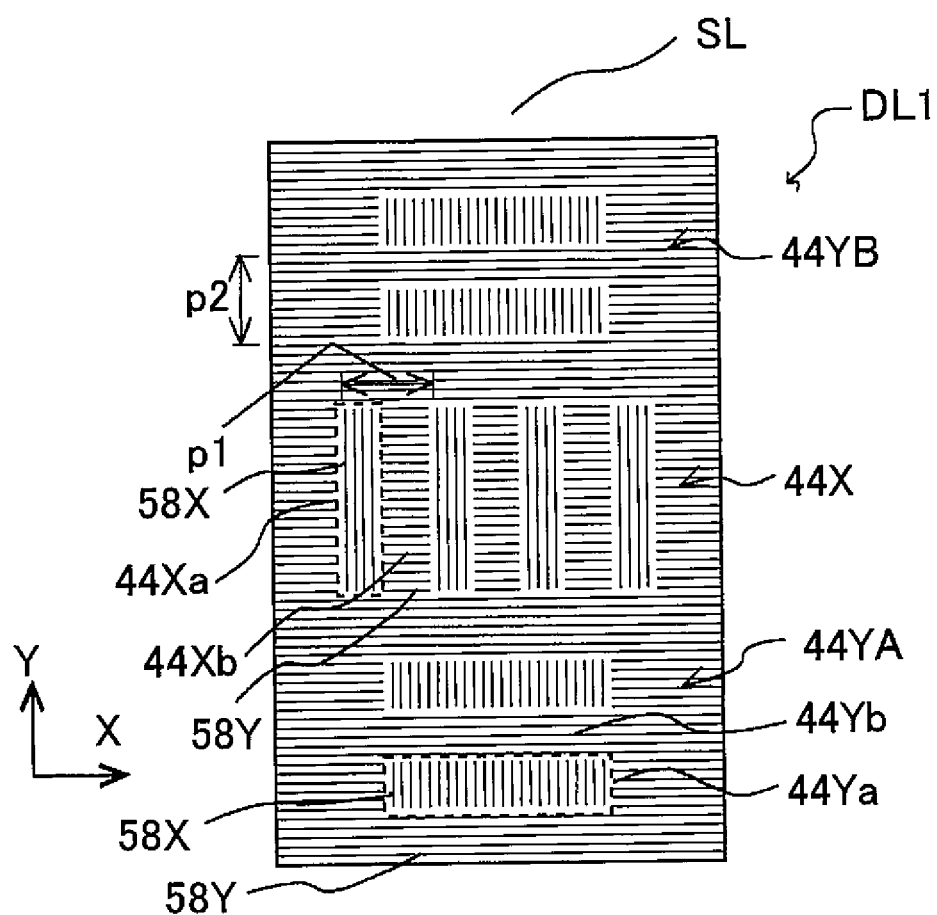
FIG. 8 is an enlarged plane view depicting the configuration of a wafer mark formed in the first embodiment.

Accordingly, the period p3a of the line patterns 58X and 58Y is smaller than the resolution limit Re(det) of the wafer alignment system ALS. Therefore, in a case that images of the wafer marks 44X, 44YA and 44YB of FIG. 8 are taken by the wafer alignment system ALS, individual images of the plurality of line patterns 58X and 58Y are not formed. In this case, when the polarization direction of the detection light is set, for example, in the X or Y direction, the reflectivity is different between the line-pattern area 44Xa and the space-pattern area 44Xb, the brightness of the entire image of the line-pattern area 44Xa is different from the brightness of the entire image of the space-pattern area 44Xb, and thus an image of the X-axis wafer mark 44X having the period p1 can be detected. Similarly, images of the Y-axis wafer marks 44YA and 44YB having the period p2 (here, p2 equals to p1) can also be detected. The information in the longitudinal direction of the line patterns 58X and 58Y constructing the wafer marks 44X, 44YA and 44YB is stored to an exposure data file in a memory (storage device) of the main controller 38 of the exposure apparatus 100.

Further, concurrently with the formation of the wafer marks 44X, 44YA and 44YB of FIG. 8, the L & S patterns 40X and 40Y depicted in FIG. 2B are formed in each of the shot areas SA of the wafer W, by using the directed self-assembly of the polymer layer containing the block copolymer in a similar manner as in the case for forming the wafer marks.

Then, in a case that a second device layer is formed on the device layer DL1 of the wafer W, a thin film is formed on the device layer DL1 of the wafer W, and coating is performed with a resist (Step 120). Afterwards, the reticle R2 is loaded onto the reticle stage RST of the exposure apparatus 100, and the wafer W is loaded onto the wafer stage WST (Step 122). Further, the angle of the polarization plate 36C of the wafer alignment system ALS of the exposure apparatus 100 is set so that the detection light from the wafer alignment system ALS becomes, for example, a linearly polarized light in the Y direction (may be in the X direction) with respect to the wafer mark 44X in FIG. 8 (Step 124). Then, the wafer alignment system ALS is used to thereby detect the positions of the wafer marks WM (44X, 44YA, 44YB) provided adjacent to a predetermined plurality of shot areas SA of the wafer W of FIG. 2A, and the alignment of the wafer W is performed by using the result of the detection (Step 126).

Further, by exposing each of the shot areas SA of the wafer W with an image of a pattern of a reticle R2 for the second device layer (Step 128), by performing the development for the resist (Step 130) and by performing a pattern formation such as the etching, etc., the pattern of the second device layer is formed (Step 132).

According to the pattern forming method of the embodiment as described above, the directed self-assembly of the polymer layer containing the block copolymer is used so as to form the L & S patterns 40X and 40Y, each having the periodic structure more minute than the resolution limit of the liquid immersion lithography, in each of the shot areas SA of the wafer W, while forming the wafer mark 44X, etc., each having a periodic structure more minute than the resolution limit of the liquid immersion lithography and a periodic structure same as or coarser than the size limit detectable by the wafer alignment system ALS, in each of the scribe line area SL. Further, in the wafer mark 44, etc., the periodic directions of the minute structures in the line-pattern area 44Xa and the space-pattern area 44Xb are orthogonal to each other. Accordingly, by using this difference in the structure, the positions of the wafer mark 44X, etc., can be detected by the wafer alignment system ALS of the exposure apparatus 100 with high precision.

The effect, etc. of the embodiment are as follows. The mark forming method by the pattern forming system of the embodiment includes: Step 106 of exposing the scribe line area SL of the wafer W with the images of the mark patterns 46X and 46YB; Step 108 of forming the resist marks RPX and RPYB including the recessed portions 70A and 70B, respectively, on the scribe line area SL based on the images of the mark patterns 46X and 46YB; Step 110 of performing coating for the areas, of the wafer W, at which the recessed portions 70A and 70B of the resist marks RPX and RPYB are formed, with the polymer layer 56 containing the block copolymer; Step 112 of performing annealing for the polymer layer 56 so as to allow the polymer layer 56 to form the self-assembly area (the lyophilic domains 56A, 56C, and the liquid-repellent areas 56B, 56D); Step 114 of selectively removing a portion (domains 56A and 56C) of the self-assembly area by the plasma etching; and Steps 116 and 118 of forming the wafer marks 44X, 44YA and 44YB on the wafer W by using the self-assembly area from which the portion of the self-assembly area has been selectively removed.

According to the mark formation method, when forming the circuit pattern by using the self-assembly of the polymer layer 56 containing the block copolymer, it is possible to form the wafer marks 44X, 44YA and 44YB each having the periodic structure more minute than the resolution limit of the liquid immersion lithography and the periodic structure same as or coarser than the size limit detectable by the wafer alignment system ALS, together with the formation of the circuit pattern.

Further, the wafer mark 44X for alignment of the embodiment includes: the plurality of line-pattern areas 44Xa formed periodically in the X direction; and at least one space-pattern area 44Xb formed between the line pattern areas 44Xa; wherein the plurality of line patterns 58X (first structure) having the period smaller than the resolution limit of the wafer alignment system ALS (structure which is optically unresolvable by the wafer alignment system ALS) is formed in each of the line pattern areas 44Xa, the plurality of line patterns 58Y (second structure) having a structure which is optically unresolvable is formed in each of the at least one space pattern area 44Xb, and the periodic direction (X direction) of the line pattern 58X is orthogonal to the periodic direction of the line pattern 58Y (Y direction). The wafer mark 44X can be formed by the mark formation method of the embodiment. Further, by utilizing the configuration that the periodic direction of the line patterns 58X and the periodic direction of the line patterns 58Y are different from each other, the image of the wafer mark 44X can be formed by the wafer alignment system ALS of the exposure apparatus 100, and the position of the wafer mark 44X can be detected with high precision. By using the result of detection, the alignment for wafer W can be performed with high precision.

Although, in the wafer mark 44X of the embodiment, both of the areas 44Xa and 44Xb have the structure which is optically unresolvable, it is allowable to provide a structure, which includes the line patterns 58X or 58Y, etc., and which is optically unresolvable, on at least one of the line-pattern area 44Xa (line portion having the period which is optically detectable) and the space-pattern area 44Xb (or the area surrounding the line-pattern area 44Xa). In this case also, the wafer mark can be formed by using the self-assembly of the block copolymer, and the wafer mark can be detected by allowing the reflectivity be different between the line portion and an area adjacent to the line portion.

Note that the above-described embodiment can be modified as follows.

Figure 9A:
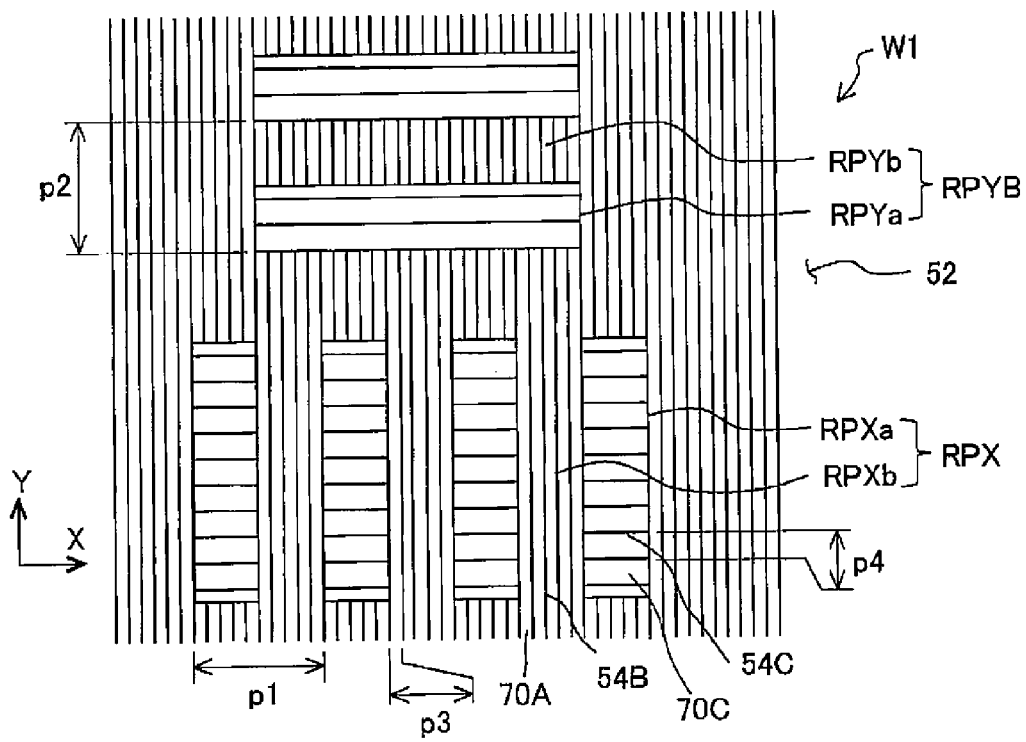
FIG. 9A is an enlarged plane view depicting a part of a resist pattern of a first modification.

In the embodiment, the period p3 of the X-axis guide pattern MB and the period p4 of the Y-axis guide pattern 54C of the resist marks RPX and RPYB are same, as depicted in FIGS. 6A and 6B. As another configuration, in the resist marks RPX and RPYB, it is allowable to make the period p4 of the Y-axis guide pattern 54C be greater than the period p3 of the X-axis guide pattern 54B, as depicted by a wafer W1 of a first modification in FIG. 9A. The first modification is applied in a case that the minutest device pattern, among the device patterns formed together, is for example the X-axis L & S pattern 40X in FIG. 2B. In the above situation, the exposure apparatus 100 uses such an illumination condition that the resolution in the X direction is minutest (for example, the dipole illumination or leaf illumination wherein the light amount is great at two areas on the pupil plane which are located apart in the X direction), in some cases. Since the resolution in the X direction is more minute than the resolution in the Y direction as described above, by performing exposure with an image of a mark pattern in which the period p4/β of the line pattern 48Y is made to be greater than the period p3/β of the line pattern 48X of FIG. 5B and by performing the slimming, it is possible to form both of the X-axis guide pattern 54B and the Y-axis guide pattern 54C depicted in FIG. 9A, with high precision.

Figure 9B:
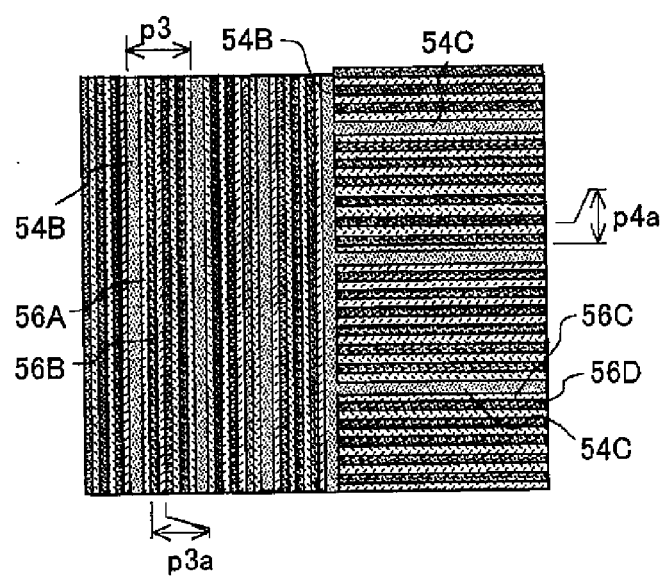
FIG. 9B is an enlarge view depicting a main portion of FIG. 9A.

By forming the polymer layer 56 containing the block copolymer in the recessed portions 70A and 70C between the guide patterns 54B and 54C, respectively, and by allowing the polymer layer 56 to undergo the directed self-assembly (to generate the directed self-assembly area) in the first modification, the domains 56A and 56B are formed between the guide patterns 54B at the period p3a in the X direction and the domains 56C and 56D between the guide patterns 54C at the period p4a in the Y direction, and the period p4a is different, for example, from the period p3a, as depicted in FIG. 9B. Note that, however, the period p4a may be same as the period p3a. After the formation of the domains, a wafer mark similar to the wafer mark of FIG. 8 can be formed by the same steps as in the above-described embodiment.

Next, as indicated by a wafer W2 of a second modification of FIG. 10A, there is presumed a case that the minutest device pattern in a first device layer DL1 of the wafer W2 is the X-axis L & S pattern 40X of FIG. 2B, and that the minutest device pattern in a second device layer DL2, different from the first device layer DL1 of the wafer W2 (for example, a second device layer DL2 provided on an insulating layer 60A arranged on the first device layer DL1) is the Y-axis L & S pattern 40Y of FIG. 2B. Further, in this presumed case, a dipole illumination apart in the X direction is used when exposing the pattern of the first device layer DL1 so as to enhance the resolution in the X direction, and a dipole illumination apart in the Y direction is used when exposing the pattern of the second device layer DL2 so as to enhance the resolution in the Y direction.

In this case, at the stage of resist pattern, a resist mark RPX is formed in the scribe line area (mark formation area) of the first device layer DL1, the resist mark RPX having an arrangement in which a plurality of line areas RPXa, each having a configuration in which guide patterns 54B elongated in the Y direction are periodically arranged in the X direction, are arranged in the X direction in a state that space areas RPXb are intervened between the line areas RPXa, as depicted in FIG. 10B. An image of the pattern of a reticle based on which the guide patterns 54B are formed is exposed by the dipole illumination in the X direction with high precision. In this modification, as an example, the resist film is allowed to remain in the space area RPXb and in the area surrounding the line area RPXa; and a polymer layer containing the block copolymer is formed in recessed portions between the guide patterns 54B and the polymer layer is allowed to undergo the directed self-assembly (to generate the directed self-assembly area). By doing so, the domains 56A and 56B are formed periodically in the X direction, as depicted in an enlarged view "B" of FIG. 10B. After this, the line patterns 58X are embedded (see FIG. 10A) in portions, of the device layer Dl, located at positions corresponding to the domains 56B, thereby forming the X-axis wafer mark 44X.

On the other hand, at the stage of resist pattern, resist marks RPYA, RPYB are formed in the scribe line area of the second device layer DL2, each of resist marks RPYA and RPYB having an arrangement in which a plurality of line areas RPYa, each having a configuration in which guide patterns 54C elongated in the X direction are periodically arranged in the Y direction, are arranged in the Y direction in a state that space areas RPYb are intervened between the line areas RPYa, as depicted in FIG. 10C. An image of the pattern of a reticle based on which the guide patterns 54C are formed is exposed by the dipole illumination in the Y direction with high precision. In this modification, as an example, the resist film is allowed to remain in the space area RPYb and in the area surrounding the line area RPYa; and a polymer layer containing the block copolymer is formed in recessed portions between the guide patterns 54C and the polymer layer is allowed to undergo the directed self-assembly (to generate the directed self-assembly area). By doing so, the domains 56C and 56D are formed periodically in the Y direction, as depicted in an enlarged view "C" of FIG. 10(C). After this, the line patterns 58Y are embedded in portions, of the device layer DL2, located at positions corresponding to the domains 56D (see FIG. 10A), thereby forming the Y-axis wafer marks 44YA and 44YB. Afterwards, the X-axis wafer mark of the first device layer DL1 and the Y-axis wafer mark of the second device layer DL2 are detected by the wafer alignment system ALS when performing the alignment for the wafer W2, thereby making it possible to perform the alignment in the X and Y directions for the wafer W2.

Figure 11A:
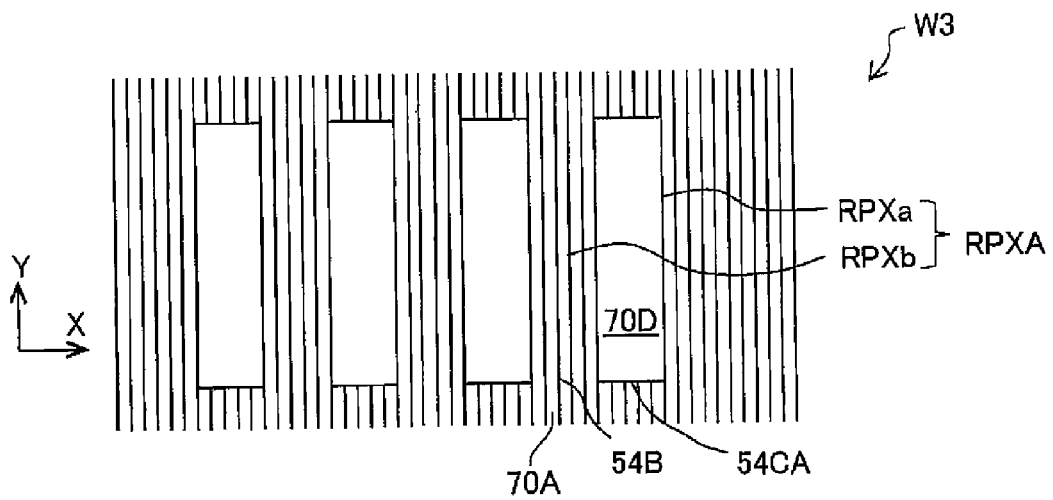
FIG. 11A is an enlarged plane view depicting a resist mark for a wafer mark of a third modification.
Figure 11B:
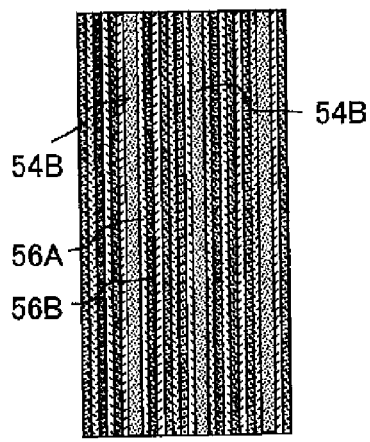
FIG. 11B is an enlarged view depicting a self-assembled pattern in a space-pattern area in FIG. 11A.
Figure 11C:
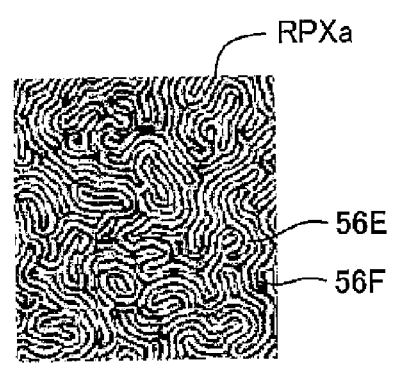
FIG. 11C is an enlarged view depicting a self-assembled pattern in a line-pattern area in FIG. 11A.

Next, as indicated by a wafer W3 of a third modification of FIG. 11A, it is allowable to form, at the stage of resist pattern, a resist mark RPXA in the scribe line area of a certain device layer of the wafer W3, the resist mark RPXA having a configuration wherein a plurality of line areas RPXa each of which is formed of a wide recessed portion 70D surrounded by a frame-shaped projected pattern 54CA elongated in the Y direction are arranged in the X direction in a state that space areas RPXb, each of which is composed of a plurality of guide patterns 54B arranged periodically in the X direction, are intervened between the line areas RPXa. In this case, the polymer layer containing the block copolymer is formed in recessed portions 70A between the guide patterns 54B in the space area RPXb and in the wide recessed portion 70D of each of the line areas RPXa, and the polymer layer containing the block copolymer is allowed to undergo the self-assembly. In this modification, between the guide patterns 54B of the space area RPXb, periodic domains 56A and 56B extending in the Y direction are formed due to the strong directionality, as depicted in FIG. 11B. On the other hand, in the recessed portion 70D inside each of the line areas RPXa, the self-assembly is generated in a state that a lyophilic domain 56E and a liquid-repellent domain 56F are randomly combined as depicted in FIG. 11C, since the directionality is weak in each of the line areas RPXa.

Afterwards, by performing processing similar to those in the above-described embodiment, an X-axis wafer mark is formed in a state that metallic line patterns are formed randomly in the line areas RPXa and that metallic line patterns elongated (extending) in the Y direction are periodically formed in the X direction in the space area RPXb. In this wafer mark also, the reflectivity of the detection light is different between the space and line areas, and thus the wafer mark can be detected by the wafer alignment system ALS.

Second Embodiment

An explanation will be given about a second embodiment, with reference to FIGS. 12 to 13D. Also in the second embodiment, a device pattern and a wafer mark are formed in a certain device layer of the wafer by using the pattern forming system of FIG. 1A while employing the directed self-assembly (DSA) of the block copolymer (BCP). Although the shot arrangement of a wafer of the second embodiment is similar to the shot arrangement of the wafer W of FIG. 2A, the second embodiment forms a device pattern DP2 in each of the shot areas SA, instead of forming the device pattern DP1.

Figure 12:
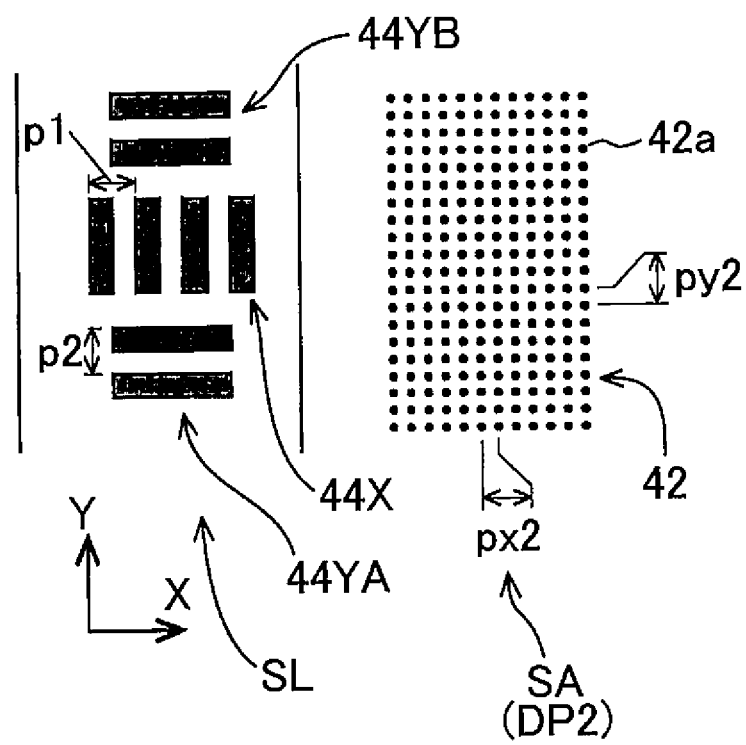
FIG. 12 is an enlarged plane view depicting one of wafer marks and a part of a circuit pattern according to a second embodiment.

FIG. 12 depicts the device pattern DP2 formed in each of the shot areas SA and the wafer marks 44X, 44YA and 44YB formed in each of the scribe lines SL of a certain device layer of a wafer (hereinafter referred to as "wafer W4") of the second embodiment. The device pattern DP2 includes a hole array 42 constructed of a large number of minute holes (via or through holes) 42$a$ which are arranged in the X direction at a period px2 and arranged in the Y direction at a period py2. Note that the holes 42$a$ is filled, for example, with a metal (for example, copper) in a latter-stage processing.

As an example, the periods px2 and py2 are substantially same, but the periods px2 and py2 may be different from each other. The diameter of the hole 42$a$ is about not more than ½ times the period px2. As an example, the periods px2 and py2 are each, for example, about one severalth of the minutest period "pmin" which can be obtained in a process in which the liquid immersion lithography using a wavelength of 193 nm and, for example, a so-called double patterning process are combined.

In the second embodiment, since the block copolymer undergoes the self-assembly so that a plurality of grid points arranged in the X and Y directions are formed during formation of the device pattern DP2, the formation of wafer mark also employs the fact that the block copolymer undergoes the self-assembly such that a plurality of grind points are formed.

Figure 13A:
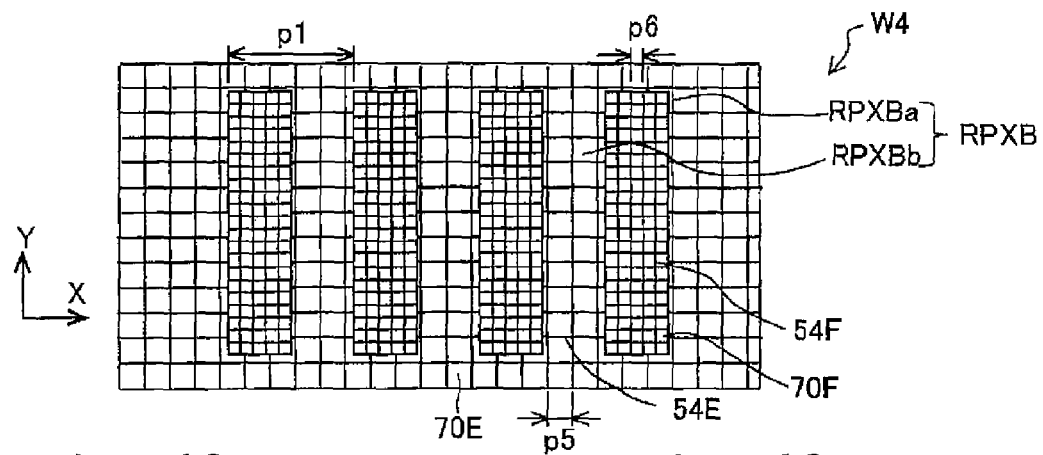
FIG. 13A is an enlarged plane view depicting a resist mark for a wafer mark.

FIG. 13A depicts an resist mark RPXB for the X-axis wafer mark 44X having the period p1 and formed in the scribe line area of the wafer W4. As an example, the resist mark RPXB has a configuration wherein a space area RPXBb, formed of grid-shaped and projected guide patterns 54E which are formed in the X and Y directions at a period p5, and a line area RPXBa, formed of grid-shaped and projected guide patterns 54F which are formed in the X and Y direction at a period p6 smaller than the period p5 (for example, the p6 being approximately ½ times the period p5), are arranged in the X direction at the period p1. The period p6 is approximately same as the resolution limit of the liquid immersion lithography using the wavelength of 193 nm. The thicknesses of the guide patterns 54E and 54F are processed to be slim (small) so that the thicknesses of the guide patterns 54E and 54F become about one severalth to about one tenth of the periods p5 and p6, respectively, by the slimming of the resist pattern, etc.

Figure 13B:
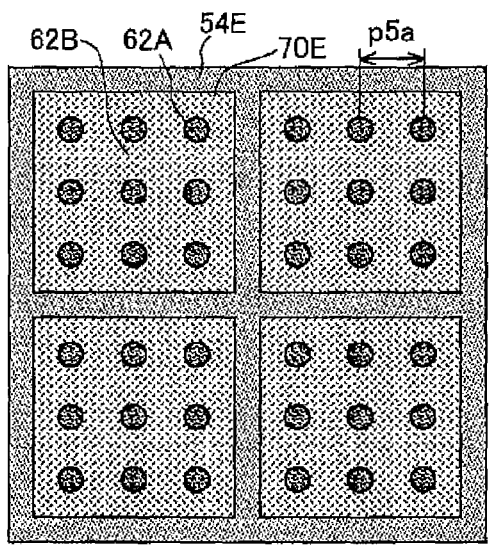
FIG. 13B is an enlarged view depicting a self-assembled pattern in a space-pattern area in FIG. 13A.

In this embodiment, by forming a polymer layer containing the block copolymer in recessed portions 70E between the grid-shaped guide patterns 54E in the space area and by allowing the polymer layer to undergo the directed self-assembly, as an example, minute circular-shaped and lyophilic domains 62A are formed inside each of the recessed portions 70E as depicted in FIG. 13B such that the domains 62A are arranged in a 3×3 matrix form in the X and Y directions at a period p5a; and that a neutral domain 62B composed of a lyophilic domain contacting with the guide pattern 54E and a liquid-repellent domain is formed between each of the guide pattern 54E and domains 62A corresponding thereto.

Figure 13C:
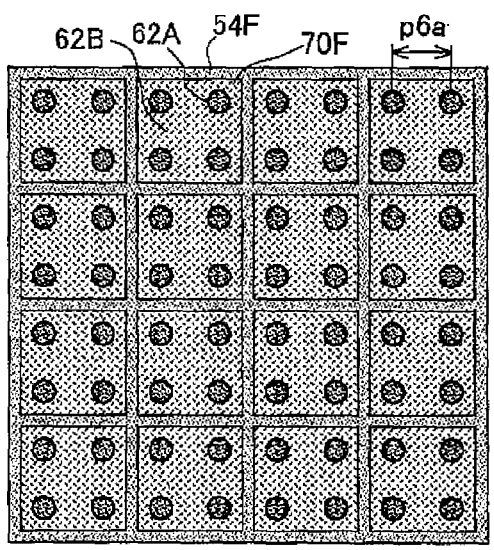
FIG. 13C is an enlarged view depicting a self-assembled pattern in a line-pattern area in FIG. 13A.
Figure 13D:
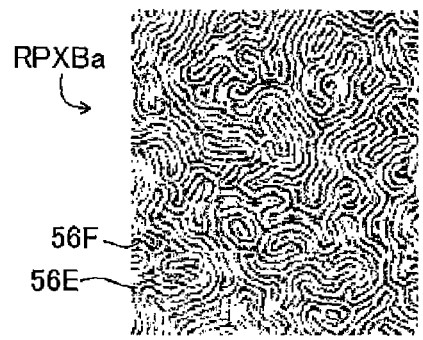
FIG. 13D is an enlarged view depicting another example of a self-assembled pattern in the line-pattern area.

On the other hand, by forming the polymer layer containing the block copolymer in recessed portions 70F between the grid-shaped guide patterns 54F in the line area and by allowing the polymer layer to undergo the directed self-assembly, as an example, the minute circular-shaped and lyophilic domains 62A are formed inside each of the recessed portions 70F as depicted in FIG. 13C such that the domains 62A are arranged in a 2×2 matrix form in the X and Y directions at a period p6a; and that the neutral domain 62B is formed between each of the guide patterns 54F and domains 62A corresponding thereto. In the embodiment, as an example, the period p5a is ⅓ times the period p5, the period p6a is ½ times the period p6, and the period p6a is made to be smaller than the period p5a, thereby making the density of the domains 62A in the line area be greater than the density of the domains 62A in the space area.

Then, in a similar manner as in the first embodiment, by selectively removing the domains 62A, by performing etching for a hard mask layer (not depicted in the drawings) provided as a layer below the domains 62A, with a pattern allowed to remain after the selective removal of the domains 62A as a mask, and by further performing etching for a device layer (not depicted in the drawings) provided as a layer below the hard mask layer, a wafer mark in which portions corresponding to the domains 62A becomes recessed portions is formed. Furthermore, for example, by embedding a metal into the recessed portions, a wafer mark including a space pattern area in which portions corresponding to the domains 62A of FIG. 13B are formed of the metal and a line pattern area in which portions corresponding to the domains 62A of FIG. 13C are formed of metal is formed. In this wafer mark, the density is different between the minute and circular-shaped metal pattern in the space pattern area and the minute and circular-shaped metal pattern in the line pattern area, and thus the reflectivity of the detection light is different between the space pattern areas and line pattern areas. Therefore, the wafer mark can be detected by the wafer alignment system ALS of the exposure apparatus 100.

Note that in this embodiment, the density of the domains 62A in the space area may be made to be higher than the density of the domains 62A in the line area.

Further, as a modification of this embodiment, it is allowable to make the inside of the line area RPXBa be a wide recessed portion, without forming the grid-shaped guide patterns 54F therein. In such a case, in the inside of the line area RPXBa, for example, lyophilic domains 56E and liquid-repellent domains 56F are arranged randomly due to the self-assembly of the block copolymer, as depicted in FIG. 13D. Alternatively, circular domains are randomly arranged in some cases. Further, by selectively removing the domains 56E, a pattern composed of random recessed portions (or random metal portions) is formed in the line area. In this case also, since the reflectively is different between portions of the regularly arranged circular recessed portion (or regularly arranged metal portions) and portions of the randomly arranged recessed portion (or randomly arranged metal portions), the wafer mark can be detected by the alignment system ALS.

Figure 14A:
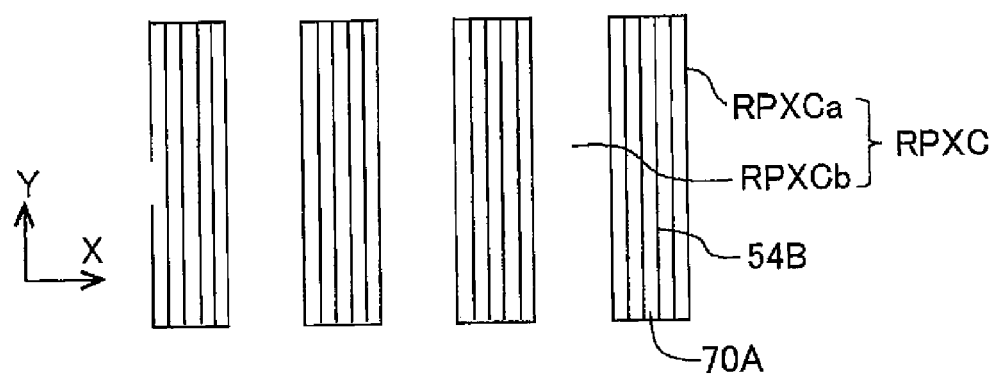
FIG. 14A is an enlarged plane view depicting a resist mark for a wafer mark of a modification.
Figure 14B:
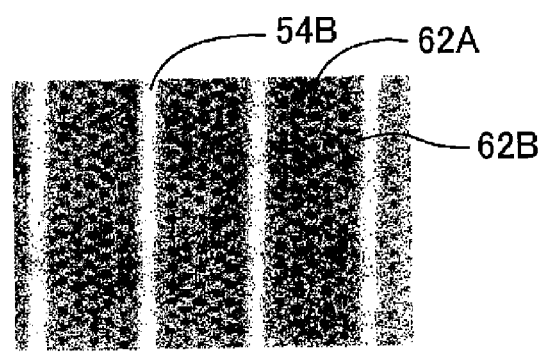
FIG. 14B is an enlarged view depicting a self-assembled pattern of a line-pattern area of FIG. 14A.

Next, as another modification of the embodiment, it is allowable to form a resist mark RPXC in which a line area RPXCa formed of a plurality of guide patterns 54B arranged periodically in the X direction and space areas RPXCb having the entire surface thereof covered with a resist are arranged in the X direction as depicted in FIG. 14A. Further, the space areas RPXCb may be made as a base layer (for example, a metallic layer). In this case, the block copolymer is allowed to undergo the directed self-assembly in such a state that a large number of holes are formed in a device pattern (not depicted in the drawings). Therefore, a polymer layer containing the block copolymer is formed in recessed portions 70A between the guide patterns 54B of the line area RPXCa, and the polymer layer containing the block copolymer is allowed to undergo the directed self-assembly. By doing so, as an example depicted in FIG. 14B, minute circular-shaped lyophilic domains 62A are regularly formed in the X and Y directions inside an intermediate domain 62B between the guide patterns 54B. Afterwards, in a similar manner as in the above-described example, by selectively removing the domains 62A and by embedding, for example, a metal in portions from which the domains 62A have been selectively removed, there is formed a wafer mark having such a shape that minute, circular-shaped metallic patterns are aligned in each of the line pattern areas and that any pattern is not present in each of the space pattern areas. Note that in this case, the line area RPXCa is not limited to being formed of the above-described minute, circular-shaped lyophilic domain 62A, and may be formed of a linear-shaped lyophilic domain 62A and the intermediate domain 62B; alternatively, it is allowable to apply an aspect of forming the line area RPXCa with a configuration wherein the lyophilic domain 56E and the liquid-repellent domain 56F are randomly arranged, as depicted in FIG. 13D. This wafer mark having this configuration can also be detected by the wafer alignment system ALS.

Figure 15:
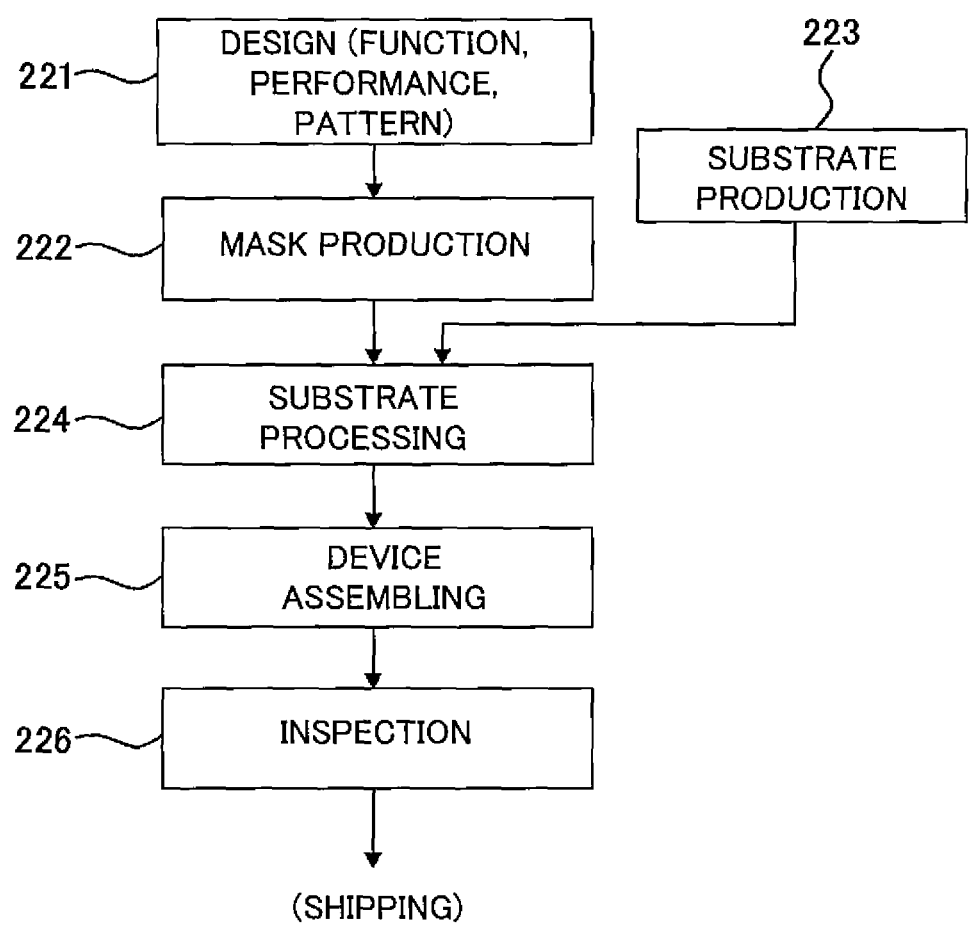
FIG. 15 is a flow chart indicating an example of steps for producing an electronic device.

Next, in a case that a semiconductor device (electronic device) such as a SRAM is produced by using the pattern forming method of the respective embodiments described above, the semiconductor device is produced, as depicted in FIG. 15, by performing a step 221 of designing the function and the performance of the semiconductor device; a step 222 of manufacturing a mask (reticle) based on the designing step; a step 223 of producing a substrate (or a base material for a wafer) for the semiconductor device; a substrate-processing step 224; a step 225 of assembling the device (including processing processes such as a dicing step, a bonding step, and a packaging step); an inspection step 226; and the like. Further, the substrate-processing step 224 includes the pattern forming method of the embodiments as described above, and the pattern forming method includes a step of exposing the substrate with a pattern of the reticle by an exposure apparatus, a step of developing the exposed substrate, a step of heating (curing) and etching the developed substrate, etc.

In other words, the method for producing the device includes the substrate-processing step 224, and the substrate-processing step 224 includes a step of forming the device pattern and the wafer mark on the substrate by using the pattern forming method of any one of the respective embodiments.

According to the method for producing the device, it is possible to produce a semiconductor device including a circuit pattern finer (more minute) than the resolution limit of the exposure apparatus, with high precision by using the exposure apparatus.

Note that devices as the object to be produced in the respective embodiments may be any semiconductor device different from the SRAM, such as DRAM (dynamic random-access memory), CPU (central processing unit), DSP (digital signal processor), etc. Further, when producing electronic devices (microdevices) different from the semiconductor devices, such as imaging elements, MEMS (Microelectromechanical Systems), etc., the pattern forming method of the respective embodiments as described above is applicable.

Further, in the above-described embodiments, it is allowable to use a dry-type exposure apparatus different from the exposure apparatus of the liquid immersion type. Furthermore, other than the exposure apparatus using the ultraviolet light as the exposure light, it is also allowable to use an EUV exposure apparatus employing an EUV light (Extreme Ultraviolet Light) of which wavelength is about several run to about several tens of nm as the exposure light, or an electron beam-exposure apparatus employing an electron beam as the exposure light, etc.

Furthermore, in the above-described embodiments, diblock copolymer composed of (Ps-b-PMMA) is used as the block copolymer. Other than this, substances usable as the block copolymer include, for example, poly(styrene-b-vinylpyridine), poly(styrene-b-butadiene), poly(styrene-b-isoprene), poly(styrene-b-methacrylate), poly(styrene-b-aromatic alkenyl), poly(isoprene-b-ethylene oxide), poly(styrene-b-(ethylene-propylene)), poly(ethylene oxide-b-caprolactone), poly(butadiene-b-ethylene oxide), poly(styrene-b-t-butyl(meth)acrylate), poly(methyl methacrylate-b-t-butyl methacrylate), poly(ethylene oxide-b-propylene oxide), poly(styrene-b-tetrahydrofuran), poly(styrene-b-isoprene-b-ethylene oxide), poly(styrene-b-dimethylsiloxane), or poly(methyl methacrylate-b-dimethylsiloxane); or diblock or triblock copolymers, etc., including a combination including at least one of the above-described block copolymers; and the like. Further, it is also possible to use a random copolymer as the block copolymer.

It is preferred that the block copolymer has overall molecular weight or polydispersity for making it possible to perform any further processing.

Further, coating of the polymer layer containing the block copolymer can be performed also by a solvent casting method wherein the coating is performed with a liquid in which the polymer layer is dissolved in a solvent, and then, for example, the solvent is allowed to volatilize. In this case, the usable solvent is changed depending on the components of the block copolymer, and in a case that additives are used, the usable solvent is changed depending on the dissolving conditions of various kinds of the additives. The exemplary casting solvents for these components and additives include propylene glycol monomethyl ether acetate (PGMEA), ethoxy ethyl propionate, anisole, ethyl lactate, 2-heptanone, cyclohexanone, amyl acetate, γ-butyrolactone (GBL), toluene, etc.

Further, additives which can be added to the polymer layer containing the block copolymer can be selected from the group including: an additional polymer (including a homopolymer, a star polymer and copolymer, a hyper-branched polymer, a block copolymer, a graft copolymer, a hyper-branched copolymer, a random copolymer, a cross-linked polymer, and an inorganic material-containing polymer); a small molecule; a nano-particle; a metallic compound; an inorganic material-containing molecule; a surfactant; a photo acid generating agent; a thermal acid generating agent; a basic quencher; a curing agent; a cross-linking agent; a chain extending agent; and a combination including at least one of the above-described substances. Here, one or plurality of additives associate(s) together with the block copolymer to form one or plural portion(s) of the self-assembly domains.

Note that the present teaching is not limited to the embodiments described above, and may be embodied in other various forms or configurations within a scope without deviating from the gist or essential characteristics of the present teaching.

What is claimed is:

1. A mark forming method comprising:
   forming recessed portion in a resist layer on a mark formation area of a substrate;
   coating the recessed portion with a polymer layer containing a block copolymer;
   allowing the polymer layer in the recessed portion to form a self-assembled area; selectively removing a portion of the self-assembled area; and
   forming a positioning mark by using the self-assembled area from which the portion of the self-assembled area has been removed and a portion of the resist layer as a mask.

2. The mark forming method according to claim 1, wherein a mark including the recessed portion is formed on the mark formation area; and
   the mark includes a plurality of line-pattern areas which are arranged periodically in a first direction and each of which includes the recessed portion, and at least one space-pattern area which is arranged between the plurality of line-pattern areas and which includes the recessed portion,
   wherein allowing the polymer layer in the recessed portion to form the self-assembled area is performed such that a periodic direction of the self-assembled area formed in the recessed portion of each line-pattern area is different from a periodic direction of the self-assembled area formed in the recessed portion of the space-pattern area.

3. The mark forming method according to claim 2, wherein the mark includes a plurality of first guide patterns, having projected and linear shape, which are arranged in the first direction at a first period in at least one of the plurality of line-pattern areas, and a plurality of second guide patterns, having projected and linear shape, which are arranged in a second direction, orthogonal to the first direction, at a second period in the space-pattern area;
   coating the recessed portion with the polymer layer is coating a plurality of first recessed portions between the plurality of first guide patterns and a plurality of second recessed portions between the plurality of second guide patterns with the polymer layer; and allowing the polymer layer to form the self-assembled area is allowing the polymer layer in the plurality of first recessed portions to form a self-assembled area having a periodicity in the first direction, and allowing the polymer layer in the plurality of second recessed portions to form a self-assembled area having a periodicity in the second direction.

4. The mark forming method according to claim 3, wherein edge portions in the first direction of the plurality of second guide patterns are connected to one first guide pattern, among the plurality of first guide patterns, located at an end portion of an arrangement of the first guide patterns.

5. The mark forming method according to claim 1, wherein a mark including the recessed portion is formed on the mark formation area;
the mark includes a plurality of first line-pattern areas which are arranged periodically in a first direction and each of which includes the recessed portion, and a plurality of second line-pattern areas which are arranged periodically in a second direction, orthogonal to the first direction, and each of which includes the recessed portion;
allowing the polymer layer to form the self-assembled area is performed such that a periodic direction of the self-assembled area formed in each recessed portion of the plurality of first line-pattern areas is different from a periodic direction of the self-assembled area formed in each recessed portion of the plurality of second line pattern areas.

6. The mark forming method according to claim 5, wherein the mark includes a plurality of first guide patterns, having projected and linear shape, which are arranged in the first direction at a first period in at least one of the plurality of first line-pattern areas, and a plurality of second guide patterns, having projected and linear shape, which are arranged in the second direction at a second period in at least one of the plurality of second line-pattern areas;
coating the recessed portion with the polymer layer is coating a plurality of first recessed portions between the plurality of first guide patterns and a plurality of second recessed portions between the plurality of second guide patterns with the polymer layer; and
allowing the polymer layer to form the self-assembled area is allowing the polymer layer in the plurality of first recessed portions to form a self-assembled area having a periodicity in the first direction, and allowing the polymer layer in the plurality of second recessed portions to form a self-assembled area having a periodicity in the second direction.

7. The mark forming method according to claim 6, wherein the mark is formed by exposing an image of the mark in the mark formation area;
in a case that the mark is formed, a resolution in the second direction is set to be lower than a resolution in the first direction; and
the second period of the plurality of second guide patterns is set to be greater than the first period of the plurality of first guide patterns.

8. The mark forming method according to claim 1, wherein a mark including the recessed portion is formed on the mark formation area;
the mark includes a line pattern area including the recessed portion and an adjacent area adjacent to the line-pattern area and including the recessed portion;
selectively removing the portion of the self-assembled area is performed such that density of recessed portions allowed to remain in the self-assembled area formed in the line-pattern area is different from density of recessed portions allowed to remain in the self-assembled area formed in the adjacent area.

9. The mark forming method according to claim 1, wherein the substrate has a first mark-formation layer in which a circuit pattern of which period is minutest in a first direction is formed, and a second mark-formation layer in which a circuit pattern of which period is minutest in a second direction orthogonal to the first direction is formed;
marks periodically arranged in the first direction are formed in the first mark-formation layer of the substrate, via a first mask layer obtained by removing the portion of the self-assembled area periodically formed in the first direction in the polymer layer; and
marks periodically arranged in the second direction are formed in the second mark-formation layer of the substrate, via a second mask layer obtained by removing the portion of the self-assembled area periodically formed in the second direction in the polymer layer.

10. A mark for positioning which is formed in a mark formation area of a substrate and which is to be optically detected by an alignment system, the mark comprising:
a plurality of line-pattern areas formed periodically in a first direction; and
at least one space-pattern area between the plurality of line-pattern areas,
wherein a first structure which is optically unresolvable by the alignment system is formed in the line-pattern areas,
a second structure which is optically unresolvable by the alignment system is formed in the space-pattern area, and
a periodic direction of the first structure is different from a periodic direction of the second structure.

11. The mark according to claim 10, wherein the first structure is periodically formed, in the first direction, between a plurality of linear patterns which are periodically formed in the first direction in each of the plurality of line pattern areas; and
the at least one space pattern is provided as a plurality of space-pattern areas, and the second structure is periodically formed, in the second direction, between a plurality of linear patterns which are periodically formed in the second direction orthogonal to the first direction in each of the plurality of space-pattern areas.

12. The mark according to claim 10, wherein the mark includes a plurality of first line-pattern areas which are arranged periodically in the first direction, and a plurality of second line-pattern areas which are arranged periodically in a second direction orthogonal to the first direction;
a first structure which is optically unresolvable is formed periodically in the first direction in each of the plurality of first line-pattern areas, and a second structure which is optically unresolvable is formed periodically in the second direction in each of the plurality of second line-pattern areas, and
period of the first structure is different from period of the second structure.

13. A method for producing a device comprising:
forming, in a substrate, an alignment mark for alignment between layers of the substrate by using the mark forming method as defined in claim 1;
performing the alignment by using the alignment mark and performing exposure for the substrate; and
processing the exposed substrate.

14. A mark forming method comprising:
forming recessed portion on a mark formation area of a substrate;
coating the recessed portion with a polymer layer containing a block copolymer;
allowing the polymer layer in the recessed portion to form a self-assembled area;
selectively removing a portion of the self-assembled area; and
forming a positioning mark by using the self-assembled area from which the portion of the self-assembled area has been removed,
wherein a mark including the recessed portion is formed on the mark formation area; and
the mark includes a plurality of line-pattern areas which are arranged periodically in a first direction and each of which includes the recessed portion, and at least one space-pattern area which is arranged between the plurality of line-pattern areas and which includes the recessed portion,
wherein allowing the polymer layer in the recessed portion to form the self-assembled area is performed such that a periodic direction of the self-assembled area formed in the recessed portion of each line-pattern area is different from a periodic direction of the self-assembled area formed in the recessed portion of the space-pattern area.

15. A mark forming method comprising:
forming recessed portion on a mark formation area of a substrate;
coating the recessed portion with a polymer layer containing a block copolymer;
allowing the polymer layer in the recessed portion to form a self-assembled area;
selectively removing a portion of the self-assembled area; and
forming a positioning mark by using the self-assembled area from which the portion of the self-assembled area has been removed,
wherein a mark including the recessed portion is formed on the mark formation area;
the mark includes a line pattern area including the recessed portion and an adjacent area adjacent to the line-pattern area and including the recessed portion;
selectively removing the portion of the self-assembled area is performed such that density of recessed portions allowed to remain in the self-assembled area formed in the line-pattern area is different from density of recessed portions allowed to remain in the self-assembled area formed in the adjacent area.

16. A mark forming method comprising:
forming recessed portion on a mark formation area of a substrate;
coating the recessed portion with a polymer layer containing a block copolymer;
allowing the polymer layer in the recessed portion to form a self-assembled area;
selectively removing a portion of the self-assembled area; and
forming a positioning mark by using the self-assembled area from which the portion of the self-assembled area has been removed,
wherein the substrate has a first mark-formation layer in which a circuit pattern of which period is minutest in a first direction is formed, and a second mark-formation layer in which a circuit pattern of which period is minutest in a second direction orthogonal to the first direction is formed;
marks periodically arranged in the first direction are formed in the first mark-formation layer of the substrate, via a first mask layer obtained by removing the portion of the self-assembled area periodically formed in the first direction in the polymer layer; and
marks periodically arranged in the second direction are formed in the second mark-formation layer of the substrate, via a second mask layer obtained by removing the portion of the self-assembled area periodically formed in the second direction in the polymer layer.

17. A mark forming method comprising:
forming recessed portion in a resist layer on a mark formation area of a substrate;
coating the recessed portion with a polymer layer containing a block copolymer;
allowing the polymer layer in the recessed portion to form a self-assembled area;
selectively removing a portion of the self-assembled area; and
forming a positioning mark by using the self-assembled area from which the portion of the self-assembled area has been removed,
wherein the polymer layer is deposited only in the recessed portion.

18. A mark for positioning which is formed in a mark formation area of a substrate, the mark comprising:
a plurality of line-pattern areas formed periodically in a first direction; and
at least one space-pattern area between the plurality of line-pattern areas,
wherein a first structure which is optically unresolvable is formed in the line-pattern areas,
a second structure which is optically unresolvable is formed in the space-pattern area, and
a periodic direction of the first structure is different from a periodic direction of the second structure,
wherein the first structure is periodically formed, in the first direction, between a plurality of linear patterns which are periodically formed in the first direction in each of the plurality of line pattern areas; and
the at least one space pattern is provided as a plurality of space-pattern areas, and the second structure is periodically formed, in the second direction, between a plurality of linear patterns which are periodically formed in the second direction orthogonal to the first direction in each of the plurality of space-pattern areas.

19. A mark for positioning which is formed in a mark formation area of a substrate, the mark comprising:
a plurality of line-pattern areas formed periodically in a first direction; and
at least one space-pattern area between the plurality of line-pattern areas,
wherein a first structure which is optically unresolvable is formed in the line-pattern areas,
a second structure which is optically unresolvable is formed in the space-pattern area,
a periodic direction of the first structure is different from a periodic direction of the second structure and
a period of the first structure and a period of the second structure are shorter than $1/100$ of a period of the plurality of line-pattern areas.

20. A mark forming method comprising:
forming a pre-pattern in a resist layer on a mark formation area of a substrate;

coating the pre-pattern with a polymer layer containing a block copolymer;

allowing the polymer layer in the pre-pattern to form a self-assembled area;

selectively removing a portion of the self-assembled area; and forming a positioning mark by using the self-assembled area from which the portion of the self-assembled area has been removed.

21. The mark forming method according to claim 20, wherein a mark including the pre-pattern is formed on the mark formation area; and the mark includes a plurality of line-pattern areas which are arranged periodically in a first direction and each of which includes the pre-pattern, and at least one space-pattern area which is arranged between the plurality of line-pattern areas and which includes the pre-pattern, wherein allowing the polymer layer in the pre-pattern to form the self-assembled area is performed such that a periodic direction of the self-assembled area formed in the pre-pattern of each line-pattern area is different from a periodic direction of the self-assembled area formed in the pre-pattern of the space-pattern area.

22. The mark forming method according to claim 21, wherein the mark includes a plurality of first guide patterns, having linear shape, which are arranged in the first direction at a first period in at least one of the plurality of line-pattern areas, and a plurality of second guide patterns, having linear shape, which are arranged in a second direction, orthogonal to the first direction, at a second period in the space-pattern area;

coating the pre-pattern with the polymer layer is coating a plurality of first pre-patterns between the plurality of first guide patterns and a plurality of second pre-patterns between the plurality of second guide patterns with the polymer layer; and allowing the polymer layer to form the self-assembled area is allowing the polymer layer in the plurality of first pre-patterns to form a self-assembled area having a periodicity in the first direction, and allowing the polymer layer in the plurality of second pre-patterns to form a self-assembled area having a periodicity in the second direction.

23. The mark forming method according to claim 22, wherein edge portions in the first direction of the plurality of second guide patterns are connected to one first guide pattern, among the plurality of first guide patterns, located at an end portion of an arrangement of the first guide patterns.

24. The mark forming method according to claim 20, wherein a mark including the pre-pattern is formed on the mark formation area;

the mark includes a plurality of first line-pattern areas which are arranged periodically in a first direction and each of which includes the pre-pattern, and a plurality of second line-pattern areas which are arranged periodically in a second direction, orthogonal to the first direction, and each of which includes the pre-pattern;

allowing the polymer layer to form the self-assembled area is performed such that a periodic direction of the self-assembled area formed in each pre-pattern of the plurality of first line-pattern areas is different from a periodic direction of the self-assembled area formed in each pre-pattern of the plurality of second line pattern areas.

25. The mark forming method according to claim 24, wherein the mark includes a plurality of first guide patterns, having linear shape, which are arranged in the first direction at a first period in at least one of the plurality of first line-pattern areas, and a plurality of second guide patterns, having linear shape, which are arranged in the second direction at a second period in at least one of the plurality of second line-pattern areas;

coating the pre-pattern with the polymer layer is coating a plurality of first pre-patterns between the plurality of first guide patterns and a plurality of second pre-patterns between the plurality of second guide patterns with the polymer layer; and allowing the polymer layer to form the self-assembled area is allowing the polymer layer in the plurality of first pre-patterns to form a self-assembled area having a periodicity in the first direction, and allowing the polymer layer in the plurality of second pre-patterns to form a self-assembled area having a periodicity in the second direction.

26. The mark forming method according to claim 25, wherein the mark is formed by exposing an image of the mark in the mark formation area;

in a case that the mark is formed, a resolution in the second direction is set to be lower than a resolution in the first direction; and the second period of the plurality of second guide patterns is set to be greater than the first period of the plurality of first guide patterns.

27. The mark forming method according to claim 20, wherein a mark including the pre-pattern is formed on the mark formation area;

the mark includes a line pattern area including the pre-pattern and an adjacent area adjacent to the line-pattern area and including the pre-pattern;

selectively removing the portion of the self-assembled area is performed such that density of pre-patterns allowed to remain in the self-assembled area formed in the line-pattern area is different from density of pre-patterns allowed to remain in the self-assembled area formed in the adjacent area.

28. The mark forming method according to claim 20, wherein the substrate has a first mark-formation layer in which a circuit pattern of which period is minutest in a first direction is formed, and a second mark-formation layer in which a circuit pattern of which period is minutest in a second direction orthogonal to the first direction is formed;

marks periodically arranged in the first direction are formed in the first mark-formation layer of the substrate, via a first mask layer obtained by removing the portion of the self-assembled area periodically formed in the first direction in the polymer layer; and marks periodically arranged in the second direction are formed in the second mark-formation layer of the substrate, via a second mask layer obtained by removing the portion of the self-assembled area periodically formed in the second direction in the polymer layer.

29. The mark forming method according to claim 20, wherein the pre-pattern is a three-dimensional pattern.

30. The mark forming method according to claim 29, wherein the pre-pattern is a recessed pattern.

31. The mark forming method according to claim 20, wherein the pre-pattern is a planar pattern.

32. An exposure method for illuminating a pattern with an exposure light and exposing a substrate with the exposure light via the pattern and a projection optical system, the exposure method comprising:

illuminating a mark, formed in the substrate, with an illumination light of which polarization state is controllable;

detecting the mark by receiving a light from the mark; and controlling, in a case that a structure unresolvable by the illumination light is included in the mark, the polarization state of the illumination light depending on a periodic direction of the structure.

33. The exposure method according to claim 32, wherein controlling the polarization state of the illumination light is performed such that a difference between an amount of a light from the mark and an amount of a light from an area around the mark is changed.

34. A method for producing a device comprising:
exposing a photosensitive substrate by using the exposure method as defined in claim 32; and
processing the exposed photosensitive substrate.

35. A method for producing a device comprising detecting an alignment mark formed on a substrate, the method further comprising:
differentiating a first property of surfaces of a plurality of first areas on the substrate from a second property of a surface of a second area which is different from the first areas;
applying a polymer containing a block copolymer on the substrate on which the plurality of first areas are provided so as to form a polymer layer;
performing a self-assembly treatment on at least a portion of the polymer layer formed in areas defined between adjacent two of the plurality of first areas;
selectively removing at least a portion of the polymer layer on which the self- assembly treatment has been performed; and
forming the alignment mark by using the polymer layer from which the at least the portion of the polymer layer has been removed.

36. The method for producing the device according to claim 35, wherein distances between adjacent two of the plurality of first areas are set such that self-assembled areas are formed in the polymer layer in the areas defined between adjacent two of the plurality of first areas.

37. The method for producing the device according to claim 36, wherein each of the plurality of first areas has linear shape.

38. The method for producing the device according to claim 37, wherein the polymer layer on which the self-assembly treatment has been performed has a structure which is periodic in a direction crossing a longitudinal direction of two of the plurality of first areas between which the polymer layer on which the self- assembly treatment has been performed is positioned.

39. The method for producing the device according to claim 35, wherein the first property of the surface of the plurality of first areas is three dimensional shape.

40. The method for producing the device according to claim 35, further comprising:
performing the self-assembly treatment on at least a portion of the polymer layer formed on the substrate in a different area different from the areas defined between adjacent two of the plurality of first areas,
selectively removing at least a portion of the polymer layer in the different area to which the self-assembly treatment has been performed; and
forming the alignment mark by using the polymer layer in the different area from which the at least the portion of the polymer layer has been removed.

41. The method for producing the device according to claim 40, wherein the different area is adjacent to the plurality of the first region.

42. The method for producing the device according to claim 41, wherein the polymer layer in the different area to which the self-assembly treatment has been performed has a random structure.

43. The method for producing the device according to claim 41, wherein the polymer layer in the different area to which the self-assembly treatment has been performed has a structure which is periodic in a first direction on the substrate and a second direction crossing the first direction.

44. The method for producing the device according to claim 35, further comprising:
aligning the substrate using a detection result of the detecting the alignment mark.

45. An exposure apparatus which illuminates a pattern with an exposure light and exposes a substrate with the exposure light via the pattern and a projection optical system, the exposure apparatus comprising:
a mark illumination system configured to illuminate a mark, formed in the substrate, with an illumination light;
a detecting section configured to receive a light from the mark so as to detect the mark, the mark having a structure which is unresolvable by the detecting section; and
a control system configured to control a polarization state of the illumination light so that the illumination light has the polarization state corresponding to the structure.

46. The exposure apparatus according to claim 45, wherein the control system is configured to control the polarization state by using an information on the mark formed in the substrate.

47. The exposure apparatus according to claim 46, wherein the mark illumination system is configured to illuminate the mark selectively with a first linear polarized illumination light of which polarization direction is a first direction and a second linear polarized illumination light of which polarization direction is a second direction crossing the first direction.

48. The exposure apparatus according to claim 47, wherein the mark includes a plurality of first line patterns of which longitudinal direction is the first direction and a plurality of second line patterns of which longitudinal direction is the second direction.

49. The exposure apparatus according to claim 45, wherein the mark includes a plurality of first line patterns of which longitudinal direction is a first direction and a plurality of second line patterns of which longitudinal direction is a second direction crossing the first direction.

50. The exposure apparatus according to claim 49, wherein the mark illumination system illuminates the mark with an illumination light having a linear polarization.

51. The exposure apparatus according to claim 50, wherein a reflectance of the plurality of first line patterns with respect to the illumination light having the linear polarization and a reflectance of the plurality of second line patterns with respect to the illumination light having the linear polarization are different from each other.

52. A method for producing a device comprising:
exposing a photosensitive substrate by using the exposure apparatus as defined in claim 45; and
processing the exposed photosensitive substrate.

53. An exposure method, in which a pattern is illuminated with an exposure light, and a substrate is exposed with the exposure light via the pattern and an projection optical system, comprising:

illuminating a mark formed in the substrate with an illumination light;

detecting the mark by receiving a light from the mark at a detection section, a structure of the mark being undetectable by the detecting section; and changing a polarization state of the illumination light so that the illumination light has the polarization state corresponding to the structure.

54. The exposure method according to claim 53, further comprising obtaining an information on the mark formed in the substrate, wherein the changing of the polarization state of the illumination light is performed by using the information.

55. The exposure method according to claim 54, wherein the changing of the polarization state of the illumination light is changing the illumination light from a first linear polarized light of which polarization direction is a first direction to a second linear polarized light of which polarization direction is a second direction crossing the first direction.

56. The exposure method according to claim 55, wherein the mark includes a plurality of first line patterns of which longitudinal direction is the first direction and a plurality of second line patterns of which longitudinal direction is the second direction.

57. The exposure method according to claim 53, wherein the mark includes a plurality of first line patterns of which longitudinal direction is a first direction and a plurality of second line patterns of which longitudinal direction is a second direction crossing the first direction.

58. The exposure method according to claim 57, wherein the illuminating of the mark is illuminating the mark with an illumination light having a linear polarization.

59. The exposure method according to claim 58, wherein a reflectance of the plurality of first line patterns with respect to the illumination light having the linear polarization and a reflectance of the plurality of second line patterns with respect to the illumination light having the linear polarization are different from each other.

\* \* \* \* \*

UNITED STATES PATENT AND TRADEMARK OFFICE
CERTIFICATE OF CORRECTION

PATENT NO. : 9,941,217 B2
APPLICATION NO. : 14/590376
DATED : April 10, 2018
INVENTOR(S) : Yuji Shiba et al.

It is certified that error appears in the above-identified patent and that said Letters Patent is hereby corrected as shown below:

In the Claims

In Column 22, Lines 28-29, change "forming recessed portion in a resist layer on a mark formation area of a substrate" to --forming recessed portion on a substrate by a resist pattern--.

In Column 22, Lines 32-34, please also insert a paragraph break between "allowing the polymer layer in the recessed portion to form a self-assembled area;" and "selectively removing a portion of the self-assembled area;".

In Column 22, Line 37, change "layer" to --pattern--.

In Column 22, Line 41, change "mark formation area" to --substrate--.

In Column 23, Line 15, change "mark formation area" to --substrate--.

In Column 23, Line 52, change "in the mark formation area" to --on the substrate--.

In Column 23, Line 61, change "mark formation area" to --substrate--.

In Column 26, Lines 15-16, change "forming recessed portion in a resist layer on a mark formation area of a substrate" to --forming recessed portion on a substrate by a resist pattern--.

Signed and Sealed this
Twenty-fourth Day of July, 2018

Andrei Iancu
*Director of the United States Patent and Trademark Office*